United States Patent
Kususe et al.

(10) Patent No.: US 8,823,031 B2
(45) Date of Patent: Sep. 2, 2014

(54) SEMICONDUCTOR LIGHT EMITTING DEVICE INCLUDING METAL REFLECTING LAYER

(75) Inventors: Takeshi Kususe, Tokushima (JP); Naoki Azuma, Katsuura-gun (JP); Toshiaki Ogawa, Anan (JP); Hisashi Kasai, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/600,145

(22) Filed: Aug. 30, 2012

(65) Prior Publication Data

US 2013/0049053 A1 Feb. 28, 2013

(30) Foreign Application Priority Data

Aug. 31, 2011 (JP) ................. 2011-189889
Jul. 30, 2012 (JP) ................. 2012-168944

(51) Int. Cl.
*H01L 33/60* (2010.01)
*H01L 33/40* (2010.01)
*H01L 33/38* (2010.01)
*H01L 33/42* (2010.01)
*H01L 33/44* (2010.01)

(52) U.S. Cl.
CPC ............. *H01L 33/405* (2013.01); *H01L 33/38* (2013.01); *H01L 33/42* (2013.01); *H01L 33/44* (2013.01)
USPC .................. 257/98; 257/99; 257/13

(58) Field of Classification Search
USPC ............... 257/98–99, 13; 385/33–34, 53, 74; 359/819, 811, 808, 812
See application file for complete search history.

(56) References Cited

U.S. PATENT DOCUMENTS

| | | | | |
|---|---|---|---|---|
| 5,300,813 | A * | 4/1994 | Joshi et al. ................... | 257/752 |
| 6,936,924 | B2 * | 8/2005 | Fukuzumi .................... | 257/758 |
| 2009/0283787 | A1 * | 11/2009 | Donofrio et al. ............. | 257/98 |

FOREIGN PATENT DOCUMENTS

| | | |
|---|---|---|
| JP | 2005-045038 | 2/2005 |
| JP | 2005-191326 | 7/2005 |
| JP | 2005-197289 | 7/2005 |
| JP | 2009-164423 | 7/2009 |

* cited by examiner

*Primary Examiner* — Eugene Lee
(74) *Attorney, Agent, or Firm* — Mori & Ward, LLP

(57) ABSTRACT

A semiconductor light emitting device includes a semiconductor structure, a transparent electrically-conducting layer, a dielectric film, and a metal reflecting layer. The semiconductor structure includes an active region. The transparent electrically-conducting layer is formed on the upper surface of the semiconductor structure. The dielectric film is formed on the upper surface of the transparent electrically-conducting layer. The metal reflecting layer is formed on the upper surface of the dielectric film. The dielectric film has at least one opening whereby partially exposing the transparent electrically-conducting layer. The transparent electrically-conducting layer is electrically connected to the metal reflecting layer through the opening. A barrier layer is partially formed and covers the opening so that the barrier layer is interposed between the transparent electrically-conducting layer and the metal reflecting layer.

37 Claims, 33 Drawing Sheets

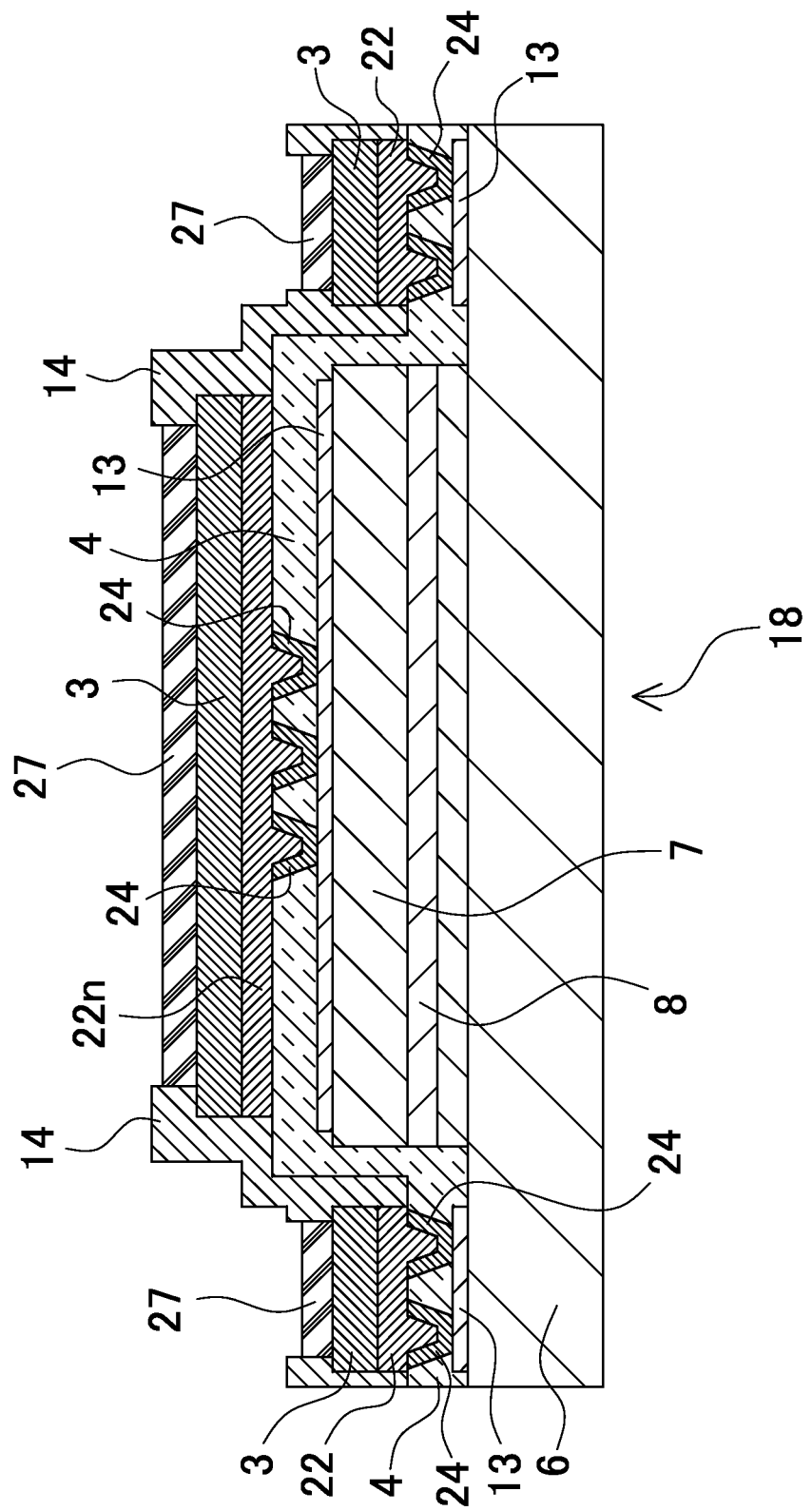

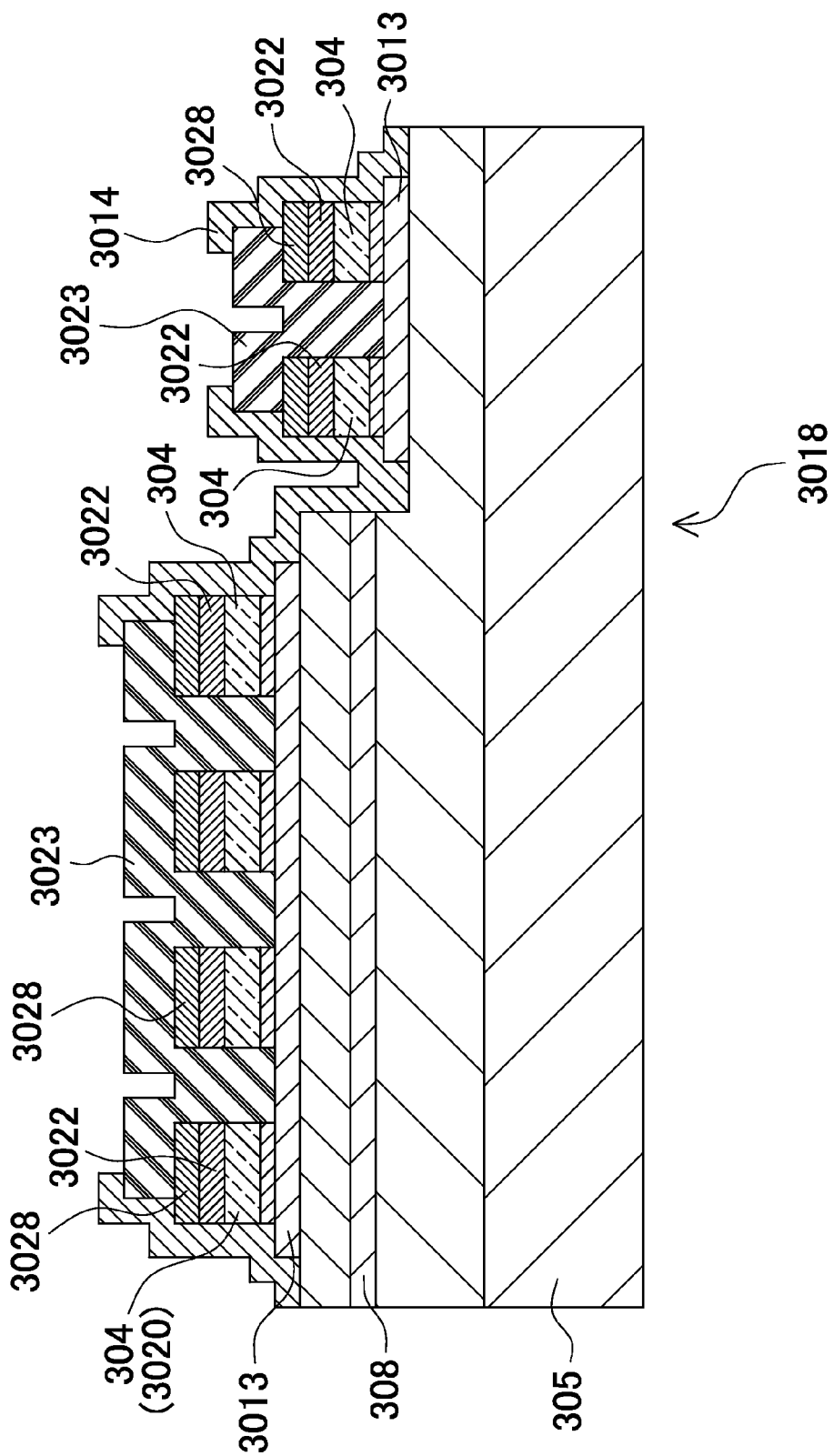

SEMICONDUCTOR LIGHT EMITTING DEVICE INCLUDING METAL REFLECTING LAYER

BACKGROUND OF THE INVENTION

1. Field of the Invention

The present invention relates to a semiconductor light emitting device.

2. Description of the Related Art

Semiconductor light emitting devices can be small and highly effective in power consumption, and can emit vivid color light. In addition, in the case of light emitting devices of semiconductor elements, there are no concerns about bulb burnout and the like. In addition, semiconductor light emitting devices have features such as excellent driven characteristics, resistance to vibration or ON/OFF repeats. Since semiconductor light emitting devices have these excellent features, semiconductor light emitting devices such as light emitting diode (hereinafter, occasionally referred to as "LED") and laser diode (hereinafter, occasionally referred to as "LD") have been used as various types of light sources. In particular, in recent years, light emitting diodes receive attention as light source for lighting replacement of fluorescent lamps, in other words, as next-generation lighting having long life and low power consumption. From this viewpoint, further improvement is required in light output and light emission efficiency.

GaN group light emitting devices include a reflecting electrode that has a transparent electrode such as ITO and a dielectric reflecting film. Particularly, in the case of a flip-chip type LED, since wire is not used in assembling, the package of a light emitting device can be small. Accordingly, it can be expected that the packaging density of LED dices is increased, which in turn increases the light intensity of the package. In addition, cost reduction, and the like can be expected. Also, there are no concerns about wire disconnection. Additionally, heat can be easily dissipated from the light emitting surface. As a result, the reliability of the light emitting device can be high even in the case where large current is applied. For this reason, the light emitting device has been used for cars.

Recently, structures for increasing light extraction efficiency have been studied. For example, in order to improve reflection efficiency, structures have been proposed which include combination of ITO and metal electrode, combination of dielectric reflecting film, or combination of dielectric material and the metal reflecting layer. In addition, it can be expected that the light emitting devices are widely used in lighting in the near future. To address this, further improvement of light extraction efficiency, and cost reduction are required.

See Japanese Patent Laid-Open Publications Nos. JP2009-164,423 A, JP2005-197,289 A, JP2005-45,038 A, and JP2005-191,326 A.

To address this issue, a light emitting device has been proposed which has combination of ITO as transparent electrode, and DBR (Distributed Bragg Reflector) as dielectric multilayers. The dielectric multilayer has an angular dependence of reflection. For this reason, in order to improve the extraction efficiency, the dielectric multilayer and metal reflecting film such as Al film are combined.

On the other hand, in order that a semiconductor element itself can efficiently emit light, it is necessary to entirely diffuse current on the surface of a p-type layer. As a suitable material for the current diffusion, as discussed above, ITO is generally used which has good ohmic contact characteristics and high transmittance. The inventors have developed a flip-chip type light emitting device having a reflection type electrode structure that has combination of ITO and dielectric film (JP2009-164,423 A). FIGS. 29A and 29B are cross-sectional views showing a light emitting device disclosed in JP2009-164,423 A. In this light emitting device, a dielectric film 294 that is constructed of three pairs of $Nb_2O_5/SiO_2$ is interposed between an ITO film 2913 and a metal electrode layer 2923. The dielectric film 294 has a plurality of openings 2921 so that the dielectric film 294 can be surely electrically connected to the metal electrode layer 2923 through the openings 2921. The dielectric film 294 has the angular dependence as discussed above. A reflecting layer 2916 is arranged on the lower surface of the dielectric film 294, in other words, between the dielectric films 294 and the ITO films 2913. The reflecting layer 2916 is also constructed of a dielectric film such as $SiO_2$ and $Al_2O_3$, and can provide total reflection effect. Since a reflecting structure 2920 is constructed of combination of the reflecting layer 2916 with the dielectric film 294, the reflecting structure 2920 can have high reflectivity even when a part of light that is emitted from a light-emitting layer 298 is incident on the reflecting structure 2920 at a slanting angle. Accordingly, it is possible to provide high extraction efficiency of light that outgoes through a light extraction surface 2918. In the case where bonding pad electrodes are further provided to this light emitting device, the pad electrodes allow this light emitting device to be mounted on a mount board in a flip-chip mounting manner by eutectic bonding using Au—Sn, or the like.

In addition, FIG. 30 is a cross-sectional view showing another light emitting device that has been developed by the applicant. In this light emitting device, a metal reflecting layer 3022 such as Al and an electrically insulating dielectric film 3028 are laminated on a dielectric film 304 that is arranged on the upper surface of an ITO film 3013 so that the vertical reflection efficiency can be improved. Also, FIG. 31 is a cross-sectional view showing the construction of the light emitting device shown in FIG. 30 that includes bonding pad electrodes 303 arranged on metal electrode layers 3023, and a protection film 3014 for covering the periphery of the light emitting device. However, in this construction, since a reflecting structure 3020 is used which includes the dielectric film 304 made from metal, (i.e., electrically-conductive reflecting layer), the electrically conductive reflecting structure may cause undesirable electrical connection in a part where electrical insulation is poor, for example, in an exposed part on the end surface, or in a part where the electrically insulating film is poorly formed. For this reason, it is necessary to prevent undesirable short circuit in a PN gap. Accordingly, the reflecting structure 3020 cannot lie astride P and N layers, and cannot entirely cover the surface of the light emitting element. As a result, the reflecting structures 3020 are formed in film formation areas on the P and N layers that are spaced away from each other. Consequently, it is unavoidable that a non-covered part that is not covered by the reflecting structure 3020 is formed in the light emitting device.

Generally, in flip-chip type light emitting device, the back side of a sapphire growth substrate 305 serves as a light emitting surface (i.e., light extraction surface) 3018. Semiconductor layers of the semiconductor light emitting element are grown on a growth surface of the growth substrate 305, which is formed of sapphire. The back side of the growth substrate 305 is opposed to the growth surface. For this reason, in the case where the non-covered part that is not covered by the reflecting structure 3020 is formed on the growth surface side, light will leak through the non-covered part, and may be reflected between the package and the die of the light emitting device, for example. In this case, there is a problem that light cannot effectively extract. FIG. 32 shows reflection of light from a light-emitting layer 308 in the light emitting device shown in FIG. 31 that is mounted onto a mount board 309 in a flip-chip mounting manner. After light is emitted from the light-emitting layer 308, a reflected part of the light that is reflected by the reflecting structure 3020 (shown by arrows on right side in FIG. 32) can effectively extract though the light extraction surface 3018. Contrary to this, a non-reflected part of the light that is not reflected by the reflecting structure 3020 (shown by arrows on left side in FIG. 32) may be reflected by the surface of the mount board 309, and absorbed by a metal layer or the like in the light emitting device.

To address this issue, the inventor studies the construction where a dielectric film 334 is arranged on the ITO film 3313, and a metal reflecting layer 3322 is directly arranged on the dielectric film 334 and the ITO film 3313 so that a pad electrode 333 is connected to a p-side electrode by a metal reflecting film that has high reflectivity as shown in a cross-sectional view of FIG. 33. However, the inventors find that, in the case where Al is used for the metal reflecting layer 3322, the contact potential difference may cause corrosion in the contact surface between Al and the ITO film 3313 when current flow, which in turn oxidizes Al and reduces the reflectivity. Also, the inventors find that, in the case where Ag is used for the metal reflecting layer, ion migration may occur, and cause deterioration. Since the metal reflecting layers having the high reflectivity will deteriorate, it is difficult to use the metal reflecting layers in application such as lighting application where high reliability is required.

The present invention is aimed at solving the problem. It is a main object of the present invention to provide a semiconductor light emitting device that can increase the extraction efficiency, and have high reliability.

SUMMARY OF THE INVENTION

To solve the above object, a semiconductor light emitting device according to a first aspect of the present invention includes a semiconductor structure 11, a transparent electrically-conducting layer 13, a dielectric film 4, and a metal reflecting layer 22. The semiconductor structure 11 includes an active region 8. The transparent electrically-conducting layer 13 is formed on or above the upper surface of the semiconductor structure 11. The dielectric film 4 is formed on or above the upper surface of the transparent electrically-conducting layer 13. The metal reflecting layer 22 is formed on or above the upper surface of the dielectric film 4. The dielectric film 4 has at least one opening 21 whereby partially exposing the transparent electrically-conducting layer 13. The transparent electrically-conducting layer 13 is electrically connected to the metal reflecting layer 22 through the opening 21. The barrier layer 24 is partially formed whereby covering the opening 21 so that the barrier layer 24 is interposed between the transparent electrically-conducting layer 13 and the metal reflecting layer 22. According to this construction, the barrier layer that is interposed between the transparent electrically-conducting layer and the metal reflecting layer can prevent direct contact between the transparent electrically-conducting layer and the metal reflecting layer. As a result, the deterioration of the metal reflecting layer can be prevented. Therefore, it is possible to increase the reliability of the nitride group compound semiconductor light emitting device. In addition, according to this construction, the metal reflecting layer can serve as an electrically conductive member and a reflection member that reflects emitted light. Therefore, it is possible to provide high light output power.

In a semiconductor light emitting device according to a second aspect of the present invention, the dielectric film 4 is preferably constructed of multilayers. According to this construction, although the dielectric multilayer has angular dependence, the combination of the dielectric multilayer and the metal reflecting layer can provide high reflectivity even when a part of light is incident on the dielectric multilayer at a slanting angle. Therefore, it is possible to provide high extraction efficiency.

In a semiconductor light emitting device according to a third aspect of the present invention, the metal reflecting layer 22 can be formed of aluminum or aluminum alloy. According to this construction, the metal reflecting layer with high reflectivity is used, while the barrier layer can suppress deterioration of the metal reflecting layer caused by contact of the metal reflecting layer with the transparent electrically-conducting layer.

In a semiconductor light emitting device according to a fourth aspect of the present invention, the barrier layer 24 can be formed of at least one element, or an alloy of at least one element selected from the group consisting of Au, Ag, Pt, Pd, Rh, Ir, Ru and Os.

In a semiconductor light emitting device according to a fifth aspect of the present invention, an adhesive layer can be further provided. The adhesive layer is arranged between the barrier layer 24 and the transparent electrically-conducting layer 13, and is formed of at least one metal or an alloy of at least one metal selected from the group consisting of Ti, Ni, Cr and Mo.

In a semiconductor light emitting device according to a sixth aspect of the present invention, the transparent electrically-conducting layer 13 can be formed of ITO.

In a semiconductor light emitting device according to a seventh aspect of the present invention, the film thickness of the barrier layer 24 can be thinner than the dielectric film 4.

In a semiconductor light emitting device according to an eighth aspect of the present invention, the barrier layer 24 can be formed only in the opening 21.

In a semiconductor light emitting device according to a ninth aspect of the present invention, the dielectric film 4 can be substantially entirely formed on the surface of the semiconductor structure 11.

In a semiconductor light emitting device according to a tenth aspect of the present invention, the transparent electrically-conducting layer 13 can be substantially entirely formed on the surface of the semiconductor structure 11. According to this construction, current can be uniformly diffused in the whole surface of the semiconductor structure.

In a semiconductor light emitting device according to an eleventh aspect of the present invention, the dielectric film 4 can cover the side surfaces of the semiconductor structure 11. According to this construction, the light that travels in the transverse direction from an active layer can efficiently outgo through a sapphire surface.

In a semiconductor light emitting device according to a twelfth aspect of the present invention, a pad electrode 3 can be further provided which is formed on or above the upper surface of the metal reflecting layer 22. The pad electrode 3 can include a plurality of smaller n-side electrodes 3a that are dispersedly arranged. According to this construction, since the n-side electrodes 3a are constructed small, it is possible to reduce absorption of light. Therefore, it is possible to increase the extraction efficiency. In addition, since the n-side electrodes 3a are dispersedly arranged, the distribution of light emission can be even. Additionally, the forward voltage can be reduced. Accordingly, the linearity can be also improved.

In a semiconductor light emitting device according to a thirteenth aspect of the present invention, the metal reflecting layer 22 can cover the side surfaces of the semiconductor structure 11.

In a semiconductor light emitting device according to a fourteenth aspect of the present invention, the semiconductor structure 11 can include n-type and p-type semiconductor layers 6, 7. The metal reflecting layer 22, which covers the side surfaces of the semiconductor structure 11, can cover the n-type semiconductor layer 6. The metal reflecting layer 22 can be spaced away from a second metal reflecting layer 22n that covers the p-type semiconductor layer 7.

In a semiconductor light emitting device according to a fifteenth aspect of the present invention, an electrode-insulating film 26 can be further provided which is arranged on or above the upper surface of the metal reflecting layer 22, which covers the side surfaces of the semiconductor structure 11. The electrode-insulating film 26 can extend and cover a spaced part between the metal reflecting layer 22 and the second metal reflecting layer 22n. N-side and p-side pad electrodes 3A and 3B can be arranged on or above the upper surface of this electrode-insulating film 26, and be spaced away from each other. According to this construction, since the n-side and p-side pad electrodes can be arranged in a multilevel structure, the areas of pad electrodes can be larger. In addition, eutectic bonding can provide a large bonding area. Therefore, the semiconductor light emitting device is advantageous in heat dissipation.

In a semiconductor light emitting device according to a sixteenth aspect of the present invention, the thickness of the barrier layer 24 that is arranged on the side surface of the dielectric film 4 can be smaller in the upper part of the opening 21 than the lower part of the opening 21.

The above and further objects of the present invention as well as the features thereof will become more apparent from the following detailed description to be made in conjunction with the accompanying drawings.

BRIEF DESCRIPTION OF THE DRAWINGS

FIG. 6A is a cross-sectional view of the semiconductor light emitting device shown in FIG. 5 taken along the line VI-VI;

FIG. 30 is a cross-sectional view showing a semiconductor light emitting device that has been developed by the applicant, and includes a reflecting film constructed of a dielectric member and a metal reflecting layer on a transparent electrode;

DETAILED DESCRIPTION OF THE EMBODIMENT(S)

The following description will describe embodiments according to the present invention with reference to the drawings. It should be appreciated, however, that the embodiments described below are illustrations of a semiconductor light emitting device used therein to give a concrete form to technical ideas of the invention, and a semiconductor light emitting device of the invention is not specifically limited to description below. However, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the positional relationships of the members in each of drawings are occasionally shown larger exaggeratingly for ease of explanation. Members same as or similar to those of this invention are attached with the same designation and the same reference signs, and their description is omitted. In addition, a plurality of structural elements of the present invention may be configured as a single part that serves the purpose of a plurality of elements, on the other hand, a single structural element may be configured as a plurality of parts that serve the purpose of a single element. Also, the term "on or above" (e.g., on or above a layer) used in the specification is not limited to the state where a member is formed in direct contact with a layer but occasionally includes the state where a member is formed upward relative to a layer to be spaced away from the layer, in other words, the state where a member is formed to interpose an intermediate member between the member and the layer in an inclusive sense. Also, the description of some of examples or embodiments may be applied to other examples, embodiments or the like.

First Embodiment

Figure 1:
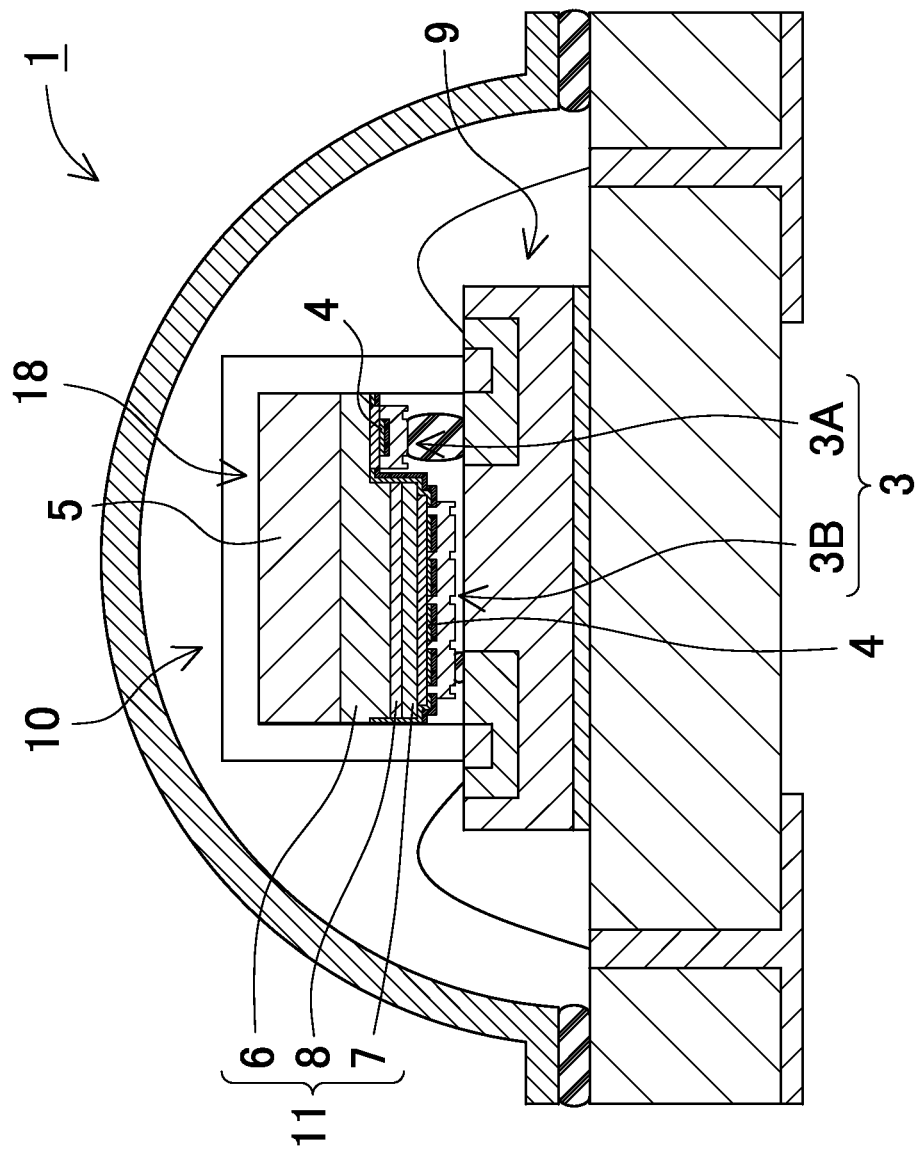
FIG. 1 is a cross-sectional view schematically showing a light emitting apparatus according to a first embodiment.

FIG. 1 is a cross-sectional view showing a light emitting apparatus 1 according to a first embodiment of the present invention. This illustrated light emitting apparatus 1 includes a light emitting device 10 of an LED chip as an exemplary nitride semiconductor device. This LED chip is mounted onto a wiring board 9, which is a sort of submount, in a flip-chip mounting manner. The flip-chip mounting manner refers to a mounting manner where a growth substrate 5 serves as a main light extraction surface through which light outgoes. Semiconductor layers are deposited on the growth substrate. The growth substrate 5 is opposed to an electrode formation surface on which an electrode is formed. The flip-chip mounting manner is also referred to as facedown mounting manner. The light emitting device 10 is shown upside down in FIG. 1 for illustrating the flip-chip mounting manner.

Figure 2:
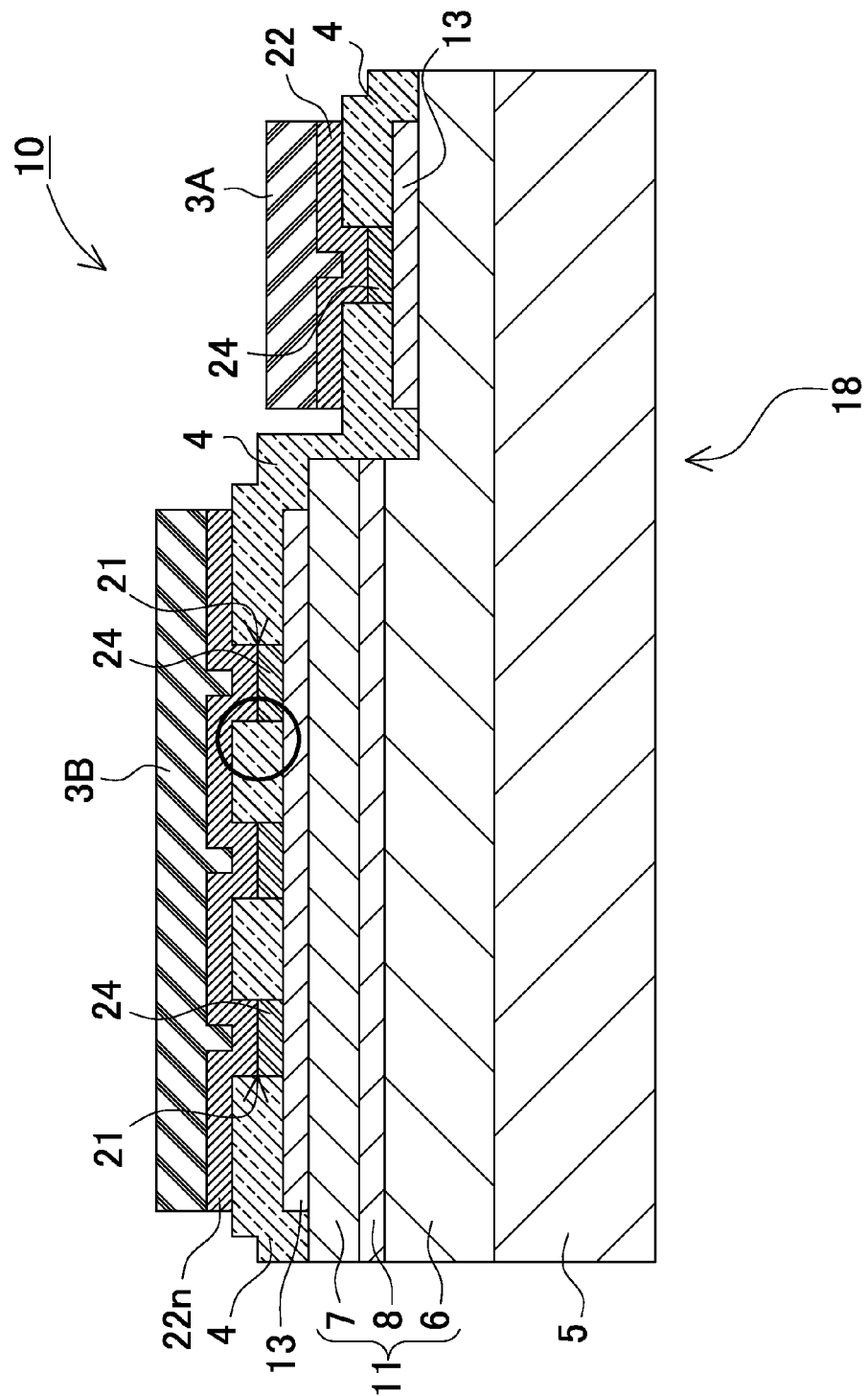
FIG. 2 is a cross-sectional view showing a semiconductor light emitting device shown in FIG. 1.

FIG. 2 is a cross-sectional view schematically showing the light emitting device 10 shown in FIG. 1 before the light emitting device is mounted to the wiring board, in other words, with the growth substrate 5 facing downward and a semiconductor structure 11 being arranged on the growth substrate. In the production processes of this light emitting apparatus, practically, the nitride semiconductor device is mounted with the layers on the upper surface of the growth substrate 5 being orientated upside down as shown in FIG. 1. The following description will schematically describe the light emitting device 10 with reference to FIG. 2. Members that are configured similarly to the members of the light emitting device 10 shown in FIG. 1 are attached with the same reference signs as the corresponding members of the light emitting device 10 shown in FIG. 2, and their description is omitted for sake of brevity.

The semiconductor light emitting device 10 shown in FIG. 2 includes the growth substrate 5, the semiconductor structure 11 that is grown on the upper surface of the growth substrate 5, and electrodes that are electrically connected to the semiconductor structure 11. The semiconductor structure 11 includes a first semiconductor layer, an active region 8, and a second semiconductor layer. For example, the first semiconductor layer is an n-type semiconductor layer 6, while the second semiconductor layer is a p-type semiconductor layer 7. The active region 8 serve as a light emitting layer. The center wavelength of the light emitted by the active region 8 can fall within the range of 360 to 650 nm, for example.

The light emitting device 10 includes the semiconductor structure 11, which has the active region 8. In the light emitting device 10 shown in FIG. 2, nitride semiconductor layers are laminated on one of a pair of main surfaces of the growth substrate 5, which are opposed to each other. The nitride semiconductor layers compose the semiconductor structure 11. Specifically, the nitride semiconductor structure 11 of the light emitting device 10 includes the n-type semiconductor layer 6 as first semiconductor layer, the active region layer 8, and the p-type nitride semiconductor layer 7 as second semiconductor layer, which are laminated on the upper surface side of the growth substrate 5, in this order. N-side and p-side pad electrodes 3A and 3B as first and second electrodes are arranged on, and electrically connected to the n-type and p-type semiconductor layers 6 and 7, respectively. When electric power is supplied to the light emitting device 10 from an external source through the n-side and p-side electrodes 3A and 3B, the active region 8 emits light so that the light outgoes mainly through the bottom surface side of the growth substrate 5 as viewed in FIG. 2. That is, in the case of the light emitting device 10 shown in FIG. 2, the other (bottom side in FIG. 2) of the main surfaces of the growth substrate 5 serves as a main light extraction surface 18 through which the light mainly outgoes. The other of main surfaces is opposed to a mount surface (top side in FIG. 2) where the electrodes 3A and 3B are formed.

(Dielectric Film 4)

Figure 3:
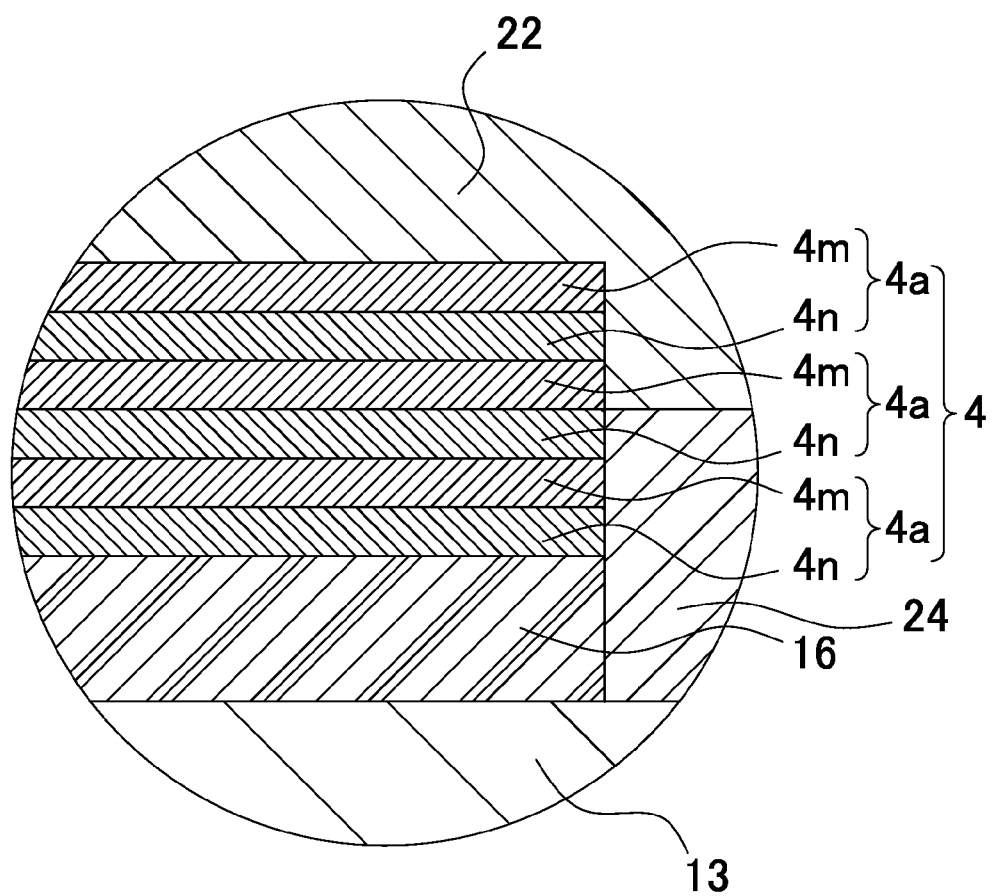
FIG. 3 is an enlarged cross-sectional view showing the lamination structure of a dielectric film shown in FIG. 2.

Each of a pair of electrodes 3, which are the n-side and p-side pad electrodes 3A and 3B, includes a dielectric film 4. FIG. 3 is an enlarged cross-sectional view showing a part of the light emitting device 10 enclosed by the thick circle in FIG. 2 in proximity to the dielectric film 4. As shown in FIG. 3, the dielectric film 4 has the multilayer structure including a plurality of dielectric members 4a. Each of the dielectric members 4a is composed of a set of two or more material layers 4n and 4m the refractive indices of which are different from each other. Thus, a plurality of sets of material layers 4n and 4m are laminated on one after another. The dielectric film 4 is arranged at least partially in a part between the semiconductor structure 11 and each of the electrodes 3. The dielectric film 4 can selectively reflect light with a desired wavelength. The specific structure of the dielectric film 4 will be described later. The dielectric film 4 may be divided into parts, which are spaced away from each other. The dielectric film 4 may be a single-layer film formed of $SiO_2$, $Al_2O_3$, or the like. The single-layer film will not reflect light but allow light to pass through the single-layer film. For this reason, particularly, in a face-up type semiconductor device as a non-flip-chip type mounting manner, the extraction efficiency of light can be improved which outgoes through the dielectric film 4 formation surface.

(Light Emitting Device 10)

For example, in the case where the light emitting device 10 is a nitride semiconductor device such as LED shown in FIG. 2, the light emitting device includes a sapphire substrate as the growth substrate 5, the nitride semiconductor structure 11, and a transparent electrically-conducting layer 13 that is formed on or above the nitride semiconductor structure 11. The nitride semiconductor structure 11 includes the n-type semiconductor layer 6 as the first nitride semiconductor layer, and the light emitting layer as the active layer 8, and the p-type semiconductor layer as the second nitride semiconductor layer 7, which are epitaxially grown on or above the sapphire substrate in this order. A reflecting layer 16 is arranged between the dielectric layer 4 and the transparent electrically-conducting layer 13. The reflecting layer 16 is constructed of dielectric films of $SiO_2$, $Al_2O_3$, or the like, and can provide total reflection effect. According to the reflecting structure that has combination of the reflective layer 16 to the dielectric film 4, even a part of light that is incident on the reflecting structure at a slanting angle can be reflected at high reflectivity by the metal reflective layer. Therefore, it is possible to provide high extraction efficiency.

Subsequently, the active region 8 and the p-type semiconductor layer 7 are selectively partially removed by etching so that the n-type semiconductor layer 6 is partially exposed. The n-type pad electrode 3A is formed on the partially exposed part of the n-type semiconductor layer. The p-type pad electrode 3B is formed on the same surface side as the n-type electrode 3A on or above the transparent electrically-conducting layer 13. In addition, only predetermined areas of the n-side and p-side pad electrode 3A and 3B are selectively exposed so that the areas other than the predetermined areas are covered by an electrically-insulating protection film 14. The n-side pad electrode 3A may be formed in the partially exposed part of the n-type semiconductor layer 6 with the transparent electrically-conducting layer 13 being interposed between the n-side pad electrode and the n-type semiconductor layer. The following description will specifically describe components of the semiconductor light emitting device 10.

(Growth Substrate 5)

The growth substrate 5 is a substrate on which the semiconductor structure 11 can be grown. The size, thickness, and the like of the growth substrate are not specifically limited. The substrate for nitride semiconductor can be electrically-insulating substrates (e.g., sapphire having C-facet, R-facet or A-facet as primary surface and spinel ($MgAl_2O_4$)), silicon carbide (6H, 4H, 3C), silicon, ZnS, ZnO, GaAs, diamond, oxide substrates (for example, lithium niobate and neodymium gallate, which are bondable with nitride semiconductor in a lattice-matching manner), and nitride semiconductor substrates (e.g., GaN and AlN). Also, the substrate for nitride semiconductor may be off-angled nitride semiconductor substrates (for example, off-angled 0.01° to 3.0° relative to the C-facet of sapphire). In addition, the growth substrate can be removed to form a substrate-less semiconductor structure after the semiconductor structure is formed on the growth substrate. Also, the thus-formed substrate-less semiconductor structure can be bonded onto a support substrate (e.g., electrically-conductive substrate) or bonded onto a support substrate in a flip-chip manner. Also, the thus-formed substrate-less semiconductor structure can be bonded onto other transparent members/transparent substrates. Specifically, in the case where the growth substrate and the bonded member/substrate are arranged on the light emitting main surface side of the semiconductor structure, they are required to be transparent. In this case, if the growth substrate is not transparent, or cuts off or absorbs light, it is necessarily removed. If the semiconductor structure is bonded onto the bonded component/substrate that is not transparent, or cuts off or absorbs light, the bonded member/substrate is necessarily arranged on the light reflection main surface side of the semiconductor structure. In the case where electric power is supplied to the semiconductor structure through the transparent substrate/member on the light extraction side, the transparent substrate/member is required to be electrically conductive. In addition to this, the semiconductor structure may be bonded onto and covered by a transparent member such as glass and resin so that the semiconductor structure is supported by the transparent member. For example, the growth substrate can be removed by grinding or LLO (Laser Lift Off) with the semiconductor light emitting device being fixed by a fixing device or on the chip mount part of the submount. Even in the case the growth substrate is transparent but a type different from the semiconductor layer structure, it is preferable that the substrate is removed. The reason is that the substrate removal can improve the light extraction efficiency and the output power of the light.

(Semiconductor Structure 11)

A nitride semiconductor is suitable for the semiconductor structure 11, and will be discussed later and in examples. The nitride semiconductor can emit short-wavelength visible light, near-ultraviolet light or light with wavelength shorter than them. Particularly, in the case where the light emitting device includes the semiconductor layers and a light conversion member (phosphor etc.) used together. A nitride semiconductor is suitable for the semiconductor structure 11. The semiconductor layer structure is not limited to this. The semiconductor structure may be formed of other semiconductors such as InGaAs group semiconductor and GaP group semiconductor.

(Light Emitting Device Construction)

The light emitting device construction of the semiconductor structure preferably has the active region 8 between the first electrically-conductive type (n-type) layer and the second electrically-conductive type (p-type) layer discussed later from viewpoint of output power and efficiency. However, the light emitting device construction is not limited to this, and can be the construction discussed later or other types of light emitting device construction. Each electrically-conductive type layer may partially include an electrically-insulating structure, a semi-electrically-insulating structure or an opposite electrically-conductive type structure. Also, the first electrically-conductive type layer and the second electrically-conductive type layer may be additionally provided with an electrically-insulating structure, a semi-electrically-insulating structure or an opposite electrically-conductive type structure. Also, the first electrically-conductive type layer and the second electrically-conductive type layer may be additionally provided with other circuit structure such as protection structure. The aforementioned substrate may serve as a part of an electrically-conductive type layer.

The electrodes for the first electrically-conductive type (n-type) layer and the second electrically-conductive type (p-type) layer are preferably arranged on one of the main surface sides of the semiconductor structure 11 as discussed later in the example. However, the electrodes are not limited to this arrangement. The electrodes may be arranged on the both main surface sides of the semiconductor structure so that the electrodes are opposed to each other. For example, one of the electrodes may be arranged on the removal side of the aforementioned substrate-removed structure.

The semiconductor structure 11 can include homo junction structure, hetero junction structure, or double-hetero junction structure having MIS junction, PIN junction or PN junction.

The layer can have a super-lattice structure. Also, the active region 8 as light emitting layer can have a quantum well structure including thin layers for quantum effect.

(Nitride Semiconductor Structure)

The nitride semiconductors are formed of general formula $In_xAl_yGa_{1-x-y}N$ ($0 \le x$, $0 \le y$, $x+y \le 1$). B, P, or As can be added to the nitride semiconductors. The n-type semiconductor layer 6 and the p-type semiconductor layer 7 are not specifically limited to a single layer or multilayer structure. The nitride semiconductor structure 11 includes the active region 8 as light emitting layer. The active region 8 has a single quantum well (SQW) or multi-quantum well structure (MQW). The nitride semiconductor structure 11 is now described in detail.

The n-type nitride semiconductor layer and the p-type nitride semiconductor layer are formed on or above the growth substrate 5 with the active region 8 being interposed between the p-type and n-type layers. A primary layer such as buffer layer of nitride semiconductor is interposed between the growth substrate 5 and the nitride semiconductor layer. For example, the primary layer can be formed of a low-temperature grown thin layer GaN and a GaN layer. The n-type nitride semiconductor layer can be formed of an n-type contact layer of Si-doped GaN, and an n-type multilayer film of GaN/InGaN, for example. The p-type nitride semiconductor layer can be formed of an Mg-doped p-type multilayer film of InGaN/AlGaN and a p-type contact layer of Mg-doped GaN.

For example, the active region (light emitting layer) 8 of the nitride semiconductor has a quantum well structure that includes well layers of $Al_aIn_bGa_{1-a-b}N$ ($0 \le a \le 1$, $0 \le b \le 1$, $a+b \le 1$) and barrier semiconductor layers of $Al_cIn_dGa_{1-c-d}N$ ($0 \le c \le 1$, $0 \le d \le 1$, $c+d \le 1$). The nitride semiconductor used for the active region 8 can be non-doped, n-type-impurity doped, or p-type-impurity doped. It is preferable that non-doped or n-type-impurity doped nitride semiconductor be used for the active region 8. The reason is that non-doped or n-type-impurity doped nitride semiconductor can increase the output power of the light emitting device. The barrier semiconductor layer is formed of a nitride semiconductor having larger band gap energy than the well layer. In the case where the well layer contains aluminum, it is possible to emit light with wavelength shorter than 365 nm corresponding to the band gap energy of GaN. The light emitted from the active region 8 can be designed to emit light with wavelength of about 360 to 650 nm, preferably 380 to 560 nm depending on the application of the light emitting device.

It is suitable that the well layer be formed of composition InGaN, which is suitable for visible or near-ultraviolet light emission. In this case, it is suitable the barrier semiconductor layer be formed of composition GaN or InGaN. The well layer preferably has a thickness not less than 1 nm and not more than 30 nm, more preferably not less than 2 nm and not more than 20 nm.

A mask with a predetermined shape is formed on the surface of the p-type semiconductor layer 7. The p-type semiconductor layer 7 and the active region 8 as light-emitting layer are partially removed by etching. Thus, a predetermined part of the n-type contact layer of the n-type semiconductor layer 6 is exposed.

(Transparent Electrically-Conducting Layer 13)

The transparent electrically-conducting layers 13 are formed on or above the n-type and p-type semiconductor layers 6 and 7. In the light emitting device according to this embodiment shown in FIG. 2, the transparent electrically-conducting layers 13 are formed on substantially the whole surfaces of the p-type semiconductor layer 7 and the exposed n-type semiconductor layer 6. Thus, current can be uniformly diffused in the whole surface of the p-type semiconductor layer 7. Since the electrically-conducting layer has transparency, the dielectric film 4 can be arranged on the transparent electrically-conducting layer. It should be noted that "form[ed] on substantially the whole surfaces" referred in this specification means form[ed] above the semiconductor structure.

Although sorts of transparent electrodes are known, the transparent electrically-conducting layer 13 is preferably formed of an oxide containing at least one element selected from the group consisting of Zn, In and Sn. Specifically, it is preferable that the transparent electrically-conducting layer 13 is formed of an oxide containing Zn, In or Sn such as ITO, ZnO, $In_2O_3$, $SnO_2$. In particular, the transparent electrically-conducting layer 13 is more preferably formed of ITO. In this case, the transparent electrically-conducting layer can be in good ohmic contact characteristics with the member to be contacted. Alternatively, the transparent electrically-conducting layer may be a metal thin film of Ni, Au, Pt, or the like, with thickness 3 nm. Also, the transparent electrically-conducting layer may be a thin film of oxide or nitride of other metal, or compound of them. Also, the transparent electrically-conducting layer may be a light-transmissible structure. Also, the transparent electrically-conducting layer may be a combination structure which combines these features with each other. Thus, the transparent electrically-conducting layer 13 is formed substantially on the whole electrically-conductive layer, for example, the p-type semiconductor layer, so that current can be uniformly diffused in the whole surface of the layer.

The thickness of the transparent electrically-conducting layer 13 can be determined in consideration of the light absorption and electrical/sheet resistance of the semiconductor layer, in other words, the dielectric film 4 and current spread of the semiconductor layer. For example, the thickness of the transparent electrically-conducting layer 13 can be not more than 1 µm, specifically, 10 to 500 nm. In addition, it is preferable that the thickness of the transparent electrically-conducting layer be an integral multiple of $\lambda/4$ ($\lambda$ is the wavelength of light emitted from the active region 8). In this case, the light extraction efficiency can be increased.

ITO as the transparent electrically-conducting layer 13 according to this embodiment has thickness of 700 A. It is preferable that, after a thick film of $SiO_2$, $Al_2O_3$, $Nb_2O_5$, or the like be formed as the reflecting layer 16 on the ITO film, the dielectric film 4 be formed of three pairs of $Nb_2O_5/SiO_2$, in other words, of $Nb_2O_5/SiO_2/Nb_2O_5/SiO_2/Nb_2O_5/SiO_2$ as shown in the enlarged cross-sectional view of FIG. 3. The thickness of each of the $Nb_2O_5$ and $SiO_2$ layer are adjusted in accordance with the wavelength of emitted light. An Rh layer with thickness of 100 A is formed as the barrier layer 24. A lamination structure of a metal reflecting layer 22 and the pad electrode 3 is constructed of (Al—Cu alloy)/Ti/Pt/Au. In the case where Ag is used for the barrier layer 24, light absorption will be reduced. As a result, it is possible to increase the extraction efficiency.

(Dielectric Film 4)

The dielectric film 4 is formed on the reflecting layer 16. The dielectric film 4 can be constructed of two to five pairs of, more preferably three to four pairs of, different-refractive-index dielectric layers. The pairs of different-refractive-index dielectric layers are arranged on each other. It is preferable that the total film thickness of the dielectric multilayer 4 fall within the range of 0.2 to 1 µm, more preferably, 0.3 to 0.6 µm. According to this construction, it is possible to suppress that the dielectric film 4 interferential action causes sharp drop in light transmittance. As a result, high reflectivity can be continuously provided in a wide wavelength range. As a result, even if the center wavelength of the dielectric film 4 is larger than the light emission peak wavelength of a light source, it is possible to suppress reduction of the reflectivity of perpendicularly-incident light. That is, it is possible to reflect not only light from the light source incident on the dielectric film 4 at a certain incidence angle but also light incident on the reflecting structure at a small incidence angle. Therefore, it is possible to relatively increase the light output power of light emitting device. Pairs of $SiO_2$ and $Nb_2O_5$ are suitable for the dielectric film 4. The dielectric film 4 has wavelength-dependent and direction-dependent reflection effect. It is preferable that the dielectric film 4 be formed on substantially the whole electrode-formation-side surface of the semiconductor light emitting device 10.

It is preferable that the dielectric film 4 cover the side surfaces of the semiconductor structure 11, and a part of the semiconductor structure 11 between the n-side and p-electrodes. According to this construction, it is possible to suppress leakage of light through a PN gap between the n-side and p-side electrodes.

(Opening 21)

The dielectric film 4 has openings 21. The openings 21 are formed so that the transparent electrically-conducting layer 13 is partially exposed as shown in the cross-sectional view of FIG. 2. As a result, the transparent electrically-conducting layer 13 can be electrically connected to the metal reflecting layer 22 and the pad electrode 3 through the openings 21.

(Barrier Layer 24)

The barrier layer 24 is arranged in the openings 21 in the dielectric film 4 where the dielectric film 4 is not arranged in the openings 21. The barrier layer 24 covers the exposed part of the transparent electrically-conducting layer 13 that is exposed in the opening 21. The metal reflecting layer 22 covers the upper surface of the barrier layer. Thus, the barrier layer 24 is interposed between the transparent electrically-conducting layer 13 and the metal reflecting layer 22. It is possible to avoid that the metal reflecting layer 22 comes in direct contact with the transparent electrically-conducting layer 13. As a result, it is possible to prevent that the contact potential difference may cause deterioration of the surface of the metal reflecting layer 22 if the metal reflecting layer is in contact with the transparent electrically-conducting layer 13. The barrier layer 24 can be formed of at least one element, or an alloy of at least one element selected from the group consisting of Au, Ag, Pt, Pd, Rh, Ir, Ru and Os. Rh is suitable for the barrier layer. It is preferable that the thickness of the barrier layer 24 be thinner than the dielectric film 4.

The barrier layer 24 can be formed by sputtering, electroless plating, vapor deposition, or the like. In the case of sputtering, the barrier layer will be formed in a U shape as viewed in section. In the case of electroless plating, the barrier layer will be formed flat.

An adhesive layer may be arranged between the barrier layer 24 and said transparent electrically-conducting layer 13. The adhesive layer can be formed of at least one metal or an alloy of at least one metal selected from the group consisting of Ti, Ni, Cr and Mo. The adhesive layer serves to bring the barrier layer 24 into adhesive with the transparent electrically-conducting layer 13. The adhesive layer has thickness of 0.3 to 50 nm, preferably 0.3 to 3 nm. In the case where the adhesive layer is thin, the light from the active region 8 can pass through the adhesive layer, and be reflected by the barrier layer 24. Thus, the high reflectivity of the barrier layer 24 can be effectively used. As a result, it is possible to provide high output power. In particular, for this purpose, Rh is suitable for the barrier layer.

(Metal Reflecting Layer 22)

The metal reflecting layer 22 is electrically connected through the barrier layer 24 and the transparent electrically-conducting layer 13 to the n-type and p-type layers of the semiconductor structure 11. The metal reflecting layer 22 can serve as an electrically conductive member and a reflection member that reflects emitted light. According to this construction, the semiconductor light emitting device 10 can increase its extraction efficiency, and can improve its reliability. The metal reflecting layer 22 can be formed of at least one selected from the group consisting of Al, Cu, Au, Pt, Pd, Rh, Ni, W, Mo, Cr, and Ti. Aluminum or an alloy of aluminum is suitable for the metal reflecting layer.

The metal reflecting layer 22 can be formed separately from the pad electrode 3. The metal reflecting layer can be formed of aluminum or an alloy of aluminum. The metal reflecting layer 22 is formed on substantially the whole surface of the light emitting area. In the case where the pad electrode 3 can have a pattern different from the metal reflecting layer 22, the pad electrode 3 can be designed in accordance with the wiring pattern of a board onto which the light emitting device is mounted in a flip-chip mounting manner. In this case, in order to reliably electrically insulate areas of the light emitting device where the pad electrode 3 is not formed, the protection film 14 of $SiO_2$ is arranged on the areas other than the pad electrode 3.

The barrier layer 24 is formed in each of the openings 21. The barrier layer 24 is formed only in the openings 21. The number of barrier layer 24 parts equals to the number of the openings 21. In the light emitting device according to this embodiment shown in FIG. 2, the dielectric film 4 pattern and the barrier layer 24 pattern are formed by using a common mask, while the pad electrode 3 pattern and the metal reflecting layer 22 pattern are formed by another common mask. As a result, the barrier layer 24 can be accurately formed in the opening 21 of the dielectric film 4. Also, the common mask can be used for formation of the dielectric film 4 pattern and the barrier layer 24 pattern, which in turn can reduce the cost. In addition, only a single mask positioning process is required for formation of the dielectric film 4 pattern and the barrier layer 24 pattern, which in turn can reduce the cost. Particularly, since the barrier layer 24 pattern is formed by using the common mask, which is also used for formation of the dielectric film 4 pattern, positional deviation will not be produced. Accordingly, it is possible to improve yields. As a result, it is possible to provide high quality light emitting devices. Also, since formation processes of the dielectric film 4 pattern and the barrier layer 24 pattern can be continuously performed, the production method can be simple. Also, since it is not necessary to take the margin prepared for positional deviation into consideration when the barrier layer is designed, the effective area of the metal reflecting layer can be increased. As a result, it is possible to improve the extraction efficiency.

As discussed above, since the barrier layer 24 can be formed in the opening 21, which is formed in the dielectric film 4, so that the barrier layer 24 fits with the diameter of the opening 21, it is possible to avoid direct contact between the transparent electrically-conducting layer 13 and the metal reflecting layer 22, and to employ a metal with high reflectivity as the metal reflecting layer 22. Also, since the dielectric film 4 is provided separately from the metal reflecting layer 22, the dielectric film 4 can be formed on the whole surface of the semiconductor light emitting device 10. As a result, it is possible to reduce leakage of light through the PN gap. In the case where an Ag group material that has high reflectivity is used as the barrier layer 24, it is possible to further increase the extraction efficiency. Since the barrier layer 24 is formed on the semiconductor structure side relative to the metal reflecting layer, it is possible to prevent ion migration of the metal reflecting layer.

The aforementioned semiconductor light emitting device 10 is mounted in a flip-chip (facedown) mounting manner. However, the mounting manner according to the present invention is not limited to the flip-chip mounting manner. The semiconductor light emitting device according to the present invention may be mounted in a face-up mounting manner.

Second Embodiment

Figure 4:
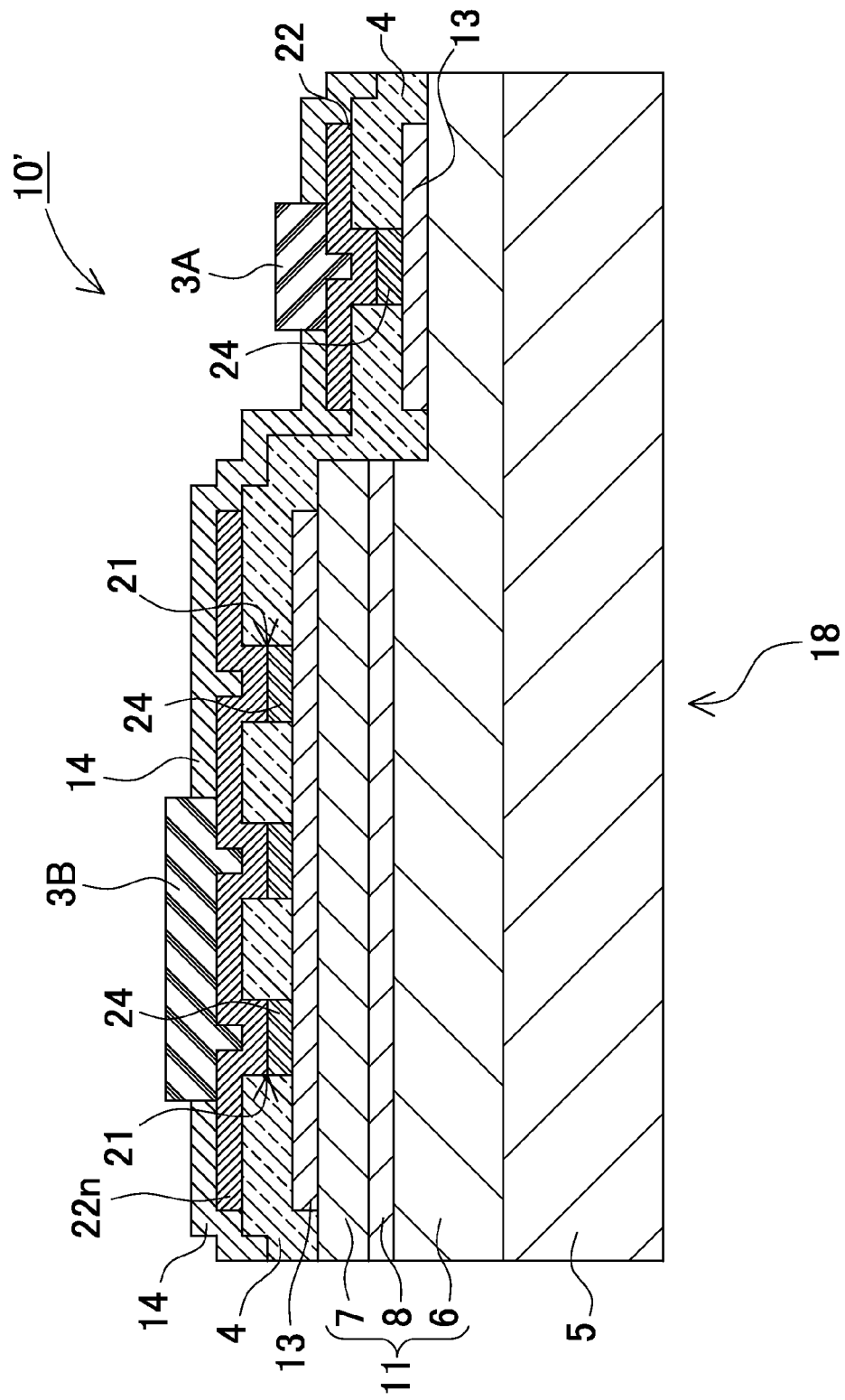
FIG. 4 is a schematic cross-sectional view showing a semiconductor light emitting device according to a second embodiment.
Figure 5:
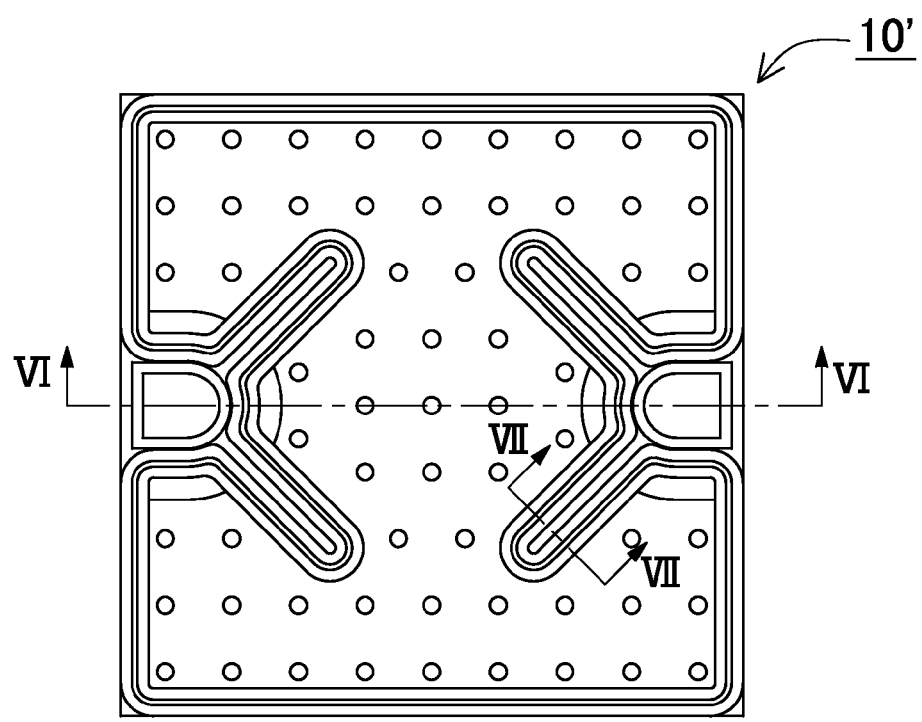
FIG. 5 is a plan view showing the semiconductor light emitting device according to the second embodiment.
Figure 6B:
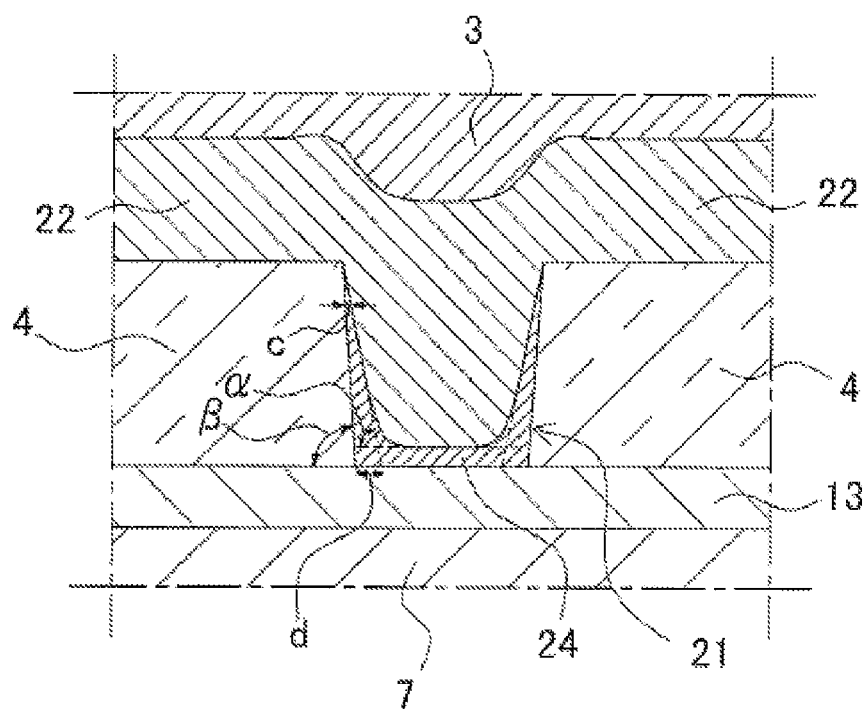
FIG. 6B is a schematic cross-sectional view showing an exemplary metal reflecting layer that is grown in an opening directly on a barrier layer.
Figure 7:
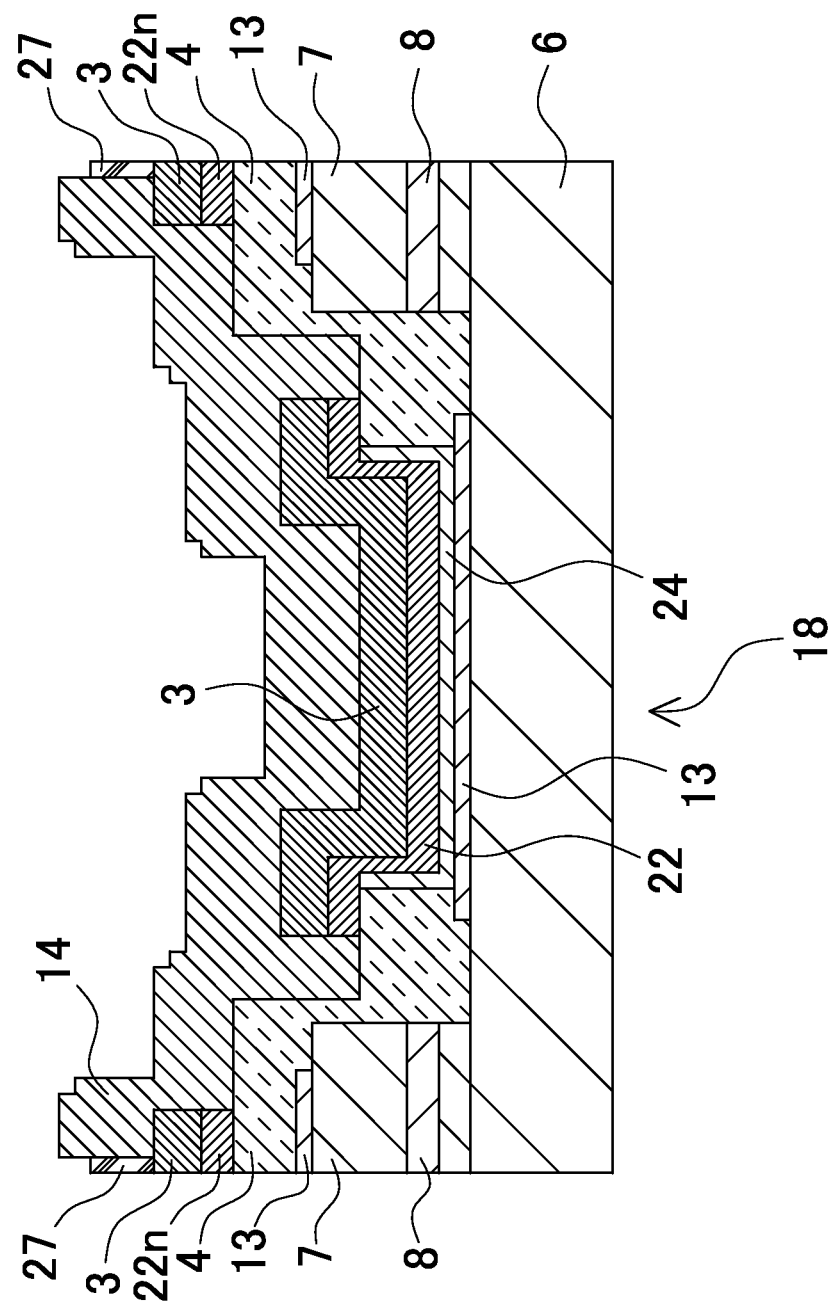
FIG. 7 is a cross-sectional view of the semiconductor light emitting device shown in FIG. 5 taken along the line VII-VII.

An eutectic-bonding pad electrode can be additionally arranged on the pad electrode. FIGS. 4 to 7 show a light emitting device 10' according to a second embodiment that includes the eutectic-bonding pad electrode. FIG. 4 is a schematic cross-sectional view showing the light emitting device 10'. FIGS. 5 to 7 show exemplary construction of the light emitting device 10' according to the second embodiment. FIG. 5 is a plan view showing the light emitting device 10'. FIG. 6A is a cross-sectional view of the light emitting device 10' shown in FIG. 5 taken along the line VI-VI. FIG. 7 is a cross-sectional view of the light emitting device 10' shown in FIG. 5 taken along the line VII-VII. The illustrated semiconductor light emitting device 10' has substantially the same construction as the light emitting device shown in FIG. 2. Components of semiconductor light emitting device 10' same as those of the light emitting device shown in FIG. 2 are attached with the same reference signs, and their description is omitted. The electrically-insulating protection film 14 covers the surface of the semiconductor light emitting device 10' shown in FIG. 4 except the pad electrode formation parts. In the light emitting device shown in FIG. 4, the barrier layer 24 is formed flat in the opening 21 only on the bottom surface of the opening 21. The barrier layer 24 can be formed in a recessed shape so that the barrier layer 24 arranged on the bottom surface and the peripheral wall part of the opening 21 as shown in FIG. 6A. In this case, light can be reflected by the side surface of the dielectric film 4 that is in contact with the barrier layer 24. In the light emitting device shown in FIG. 6A, eutectic-bonding pad electrodes 27 are arranged on the upper surfaces of the pad electrodes 3.

Since the barrier layer is arranged in the opening, it is possible to provide an advantage that disconnection of the metal reflecting layer that is arranged on the barrier layer is prevented. The advantage is described with reference to FIG. 6B. FIG. 6B is a schematic cross-sectional view showing an example of the metal reflecting layer 22 that is grown in the opening 21 directly on the barrier layer 24. If the metal reflecting layer 22 is grown directly on the transparent electrically-conducting layer without the barrier layer in the opening 21, the metal reflecting layer 22 can be grown easily in the vertical direction but is less prone to being grown in the transverse direction. As a result, the metal reflecting layer 22 may be partially thin in particular in the edge part, which is the boundary between the side surface and the upper surface of the dielectric film 4 in the opening. For this reason, the electrical resistance value of the thin part of the metal reflecting layer 22 will be high so that current cannot smoothly flow through the thin part. Also, a burr may be produced in the thin part of the metal reflecting layer 22. This may cause physical poor contact or disconnection. In particular, the thin part of the metal reflecting layer 22 will be more likely to be produced as the side surface of the dielectric film 4 becomes closer to the vertical direction. For this reason, the side surface of the dielectric film 4 can be inclined as shown in FIG. 6A so that the edge part of the dielectric film 4 can be an obtuse angle, in other words, the wall part of the opening 21 is sloped. According to this construction, it is possible to suppress that sharp growth direction change makes the metal reflecting layer 22 thin in the edge part. As a result, the metal reflecting layer 22 can be formed in a good film. In addition, since the barrier layer 24 is arranged on the bottom surface of the opening 21 so that the depth of the opening 21 becomes small, it is possible to suppress that the metal reflecting layer 22 becomes thinner in the edge part.

In the case where the side surface of the dielectric film 4 is inclined so that the edge part of the dielectric film 4 is an obtuse angle, when the barrier layer 24 is arranged on the side surface of the dielectric film 4 in the opening, the obtuse angle can be larger. Since the obtuse angle can be larger, the slope of the opening 21 can be gentle. As a result, it is possible to further improve the reliability of the metal reflecting layer 22. However, the side surface of the dielectric film according to the present invention is not limited to an inclined surface. Even in the case where the side surface of the dielectric film is the vertical direction or a direction close to the vertical direction, when the barrier layer is arranged on the dielectric film side surface, the slope of the opening can be gentler.

In the case where the barrier layer 24 is arranged not only on the bottom surface of the opening 21 but also on the peripheral wall of the opening 21 as shown in FIG. 6A, it is also possible to suppress that the metal reflecting layer 22 becomes thinner in the edge part of the dielectric film 4. That is, in the case where the barrier layer 24 is inclined from the edge part of the dielectric film 4 toward the bottom surface of the opening 21, the edge part can be an obtuse angle as shown in FIG. 6B. Accordingly, it is possible to suppress that the metal reflecting layer 22 becomes partially thin. As a result, the metal reflecting layer 22 can be formed in a good film.

Specifically, it is preferable that the angle α of the inclined surface of the barrier layer 24 that is arranged on the side surface of the dielectric film 4 be larger than the inclination angle β of the side surface of the dielectric film 4 as shown in FIG. 6B. Also, it is preferable that the thickness in the upper part of the opening 21 (thickness c) of the barrier layer 24 that is arranged on the side surface of the dielectric film 4 be smaller than the thickness in the lower part of the opening 21 (thickness d) of the barrier layer 24 that is arranged on the side surface of the dielectric film 4. The thickness d in the lower part of the opening of the barrier layer can be defined as the distance between the dielectric film 4 and the intersection that is formed by the bottom surface of the opening 21 and the extension line of the inclined surface of the barrier layer 24 that extends toward the bottom surface of the opening 21, for example.

Figure 8:
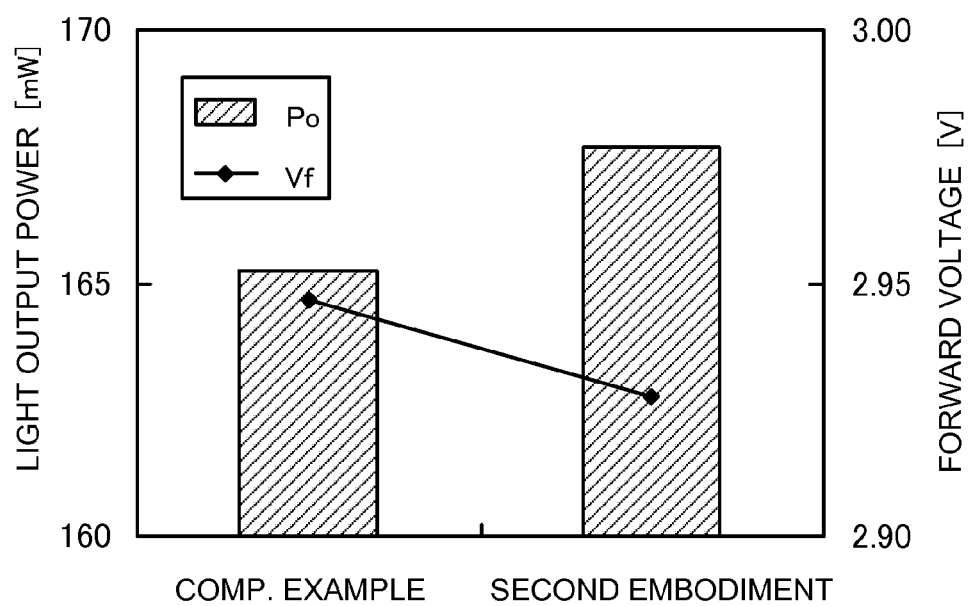
FIG. 8 is a graph showing the comparison of light output power and forward voltage between semiconductor light emitting devices according to the second embodiment and a comparative example.
Figure 31:
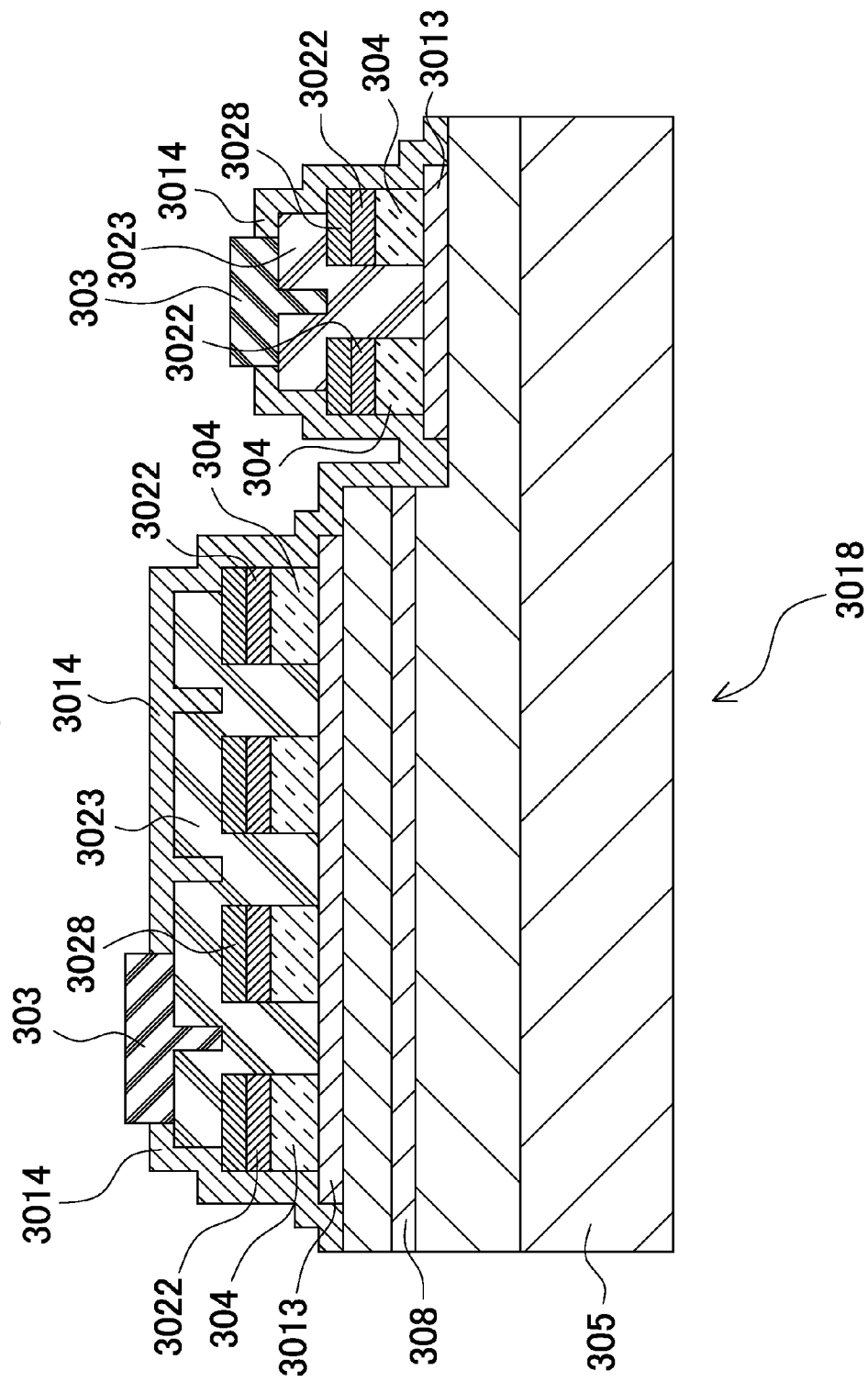
FIG. 31 is a cross-sectional view showing another semiconductor light emitting device that has been developed by the applicant.
Figure 32:
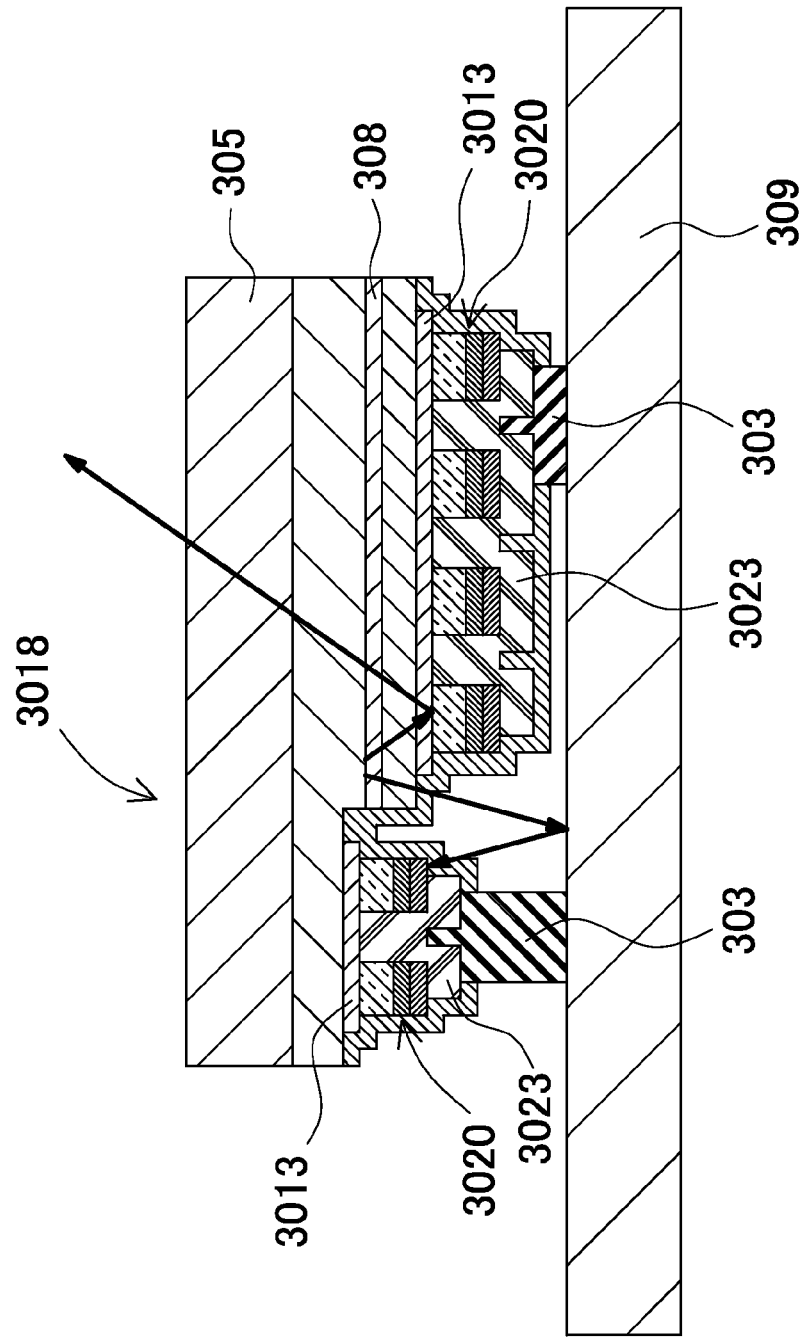
FIG. 32 is a vertical cross-sectional view showing light loss caused by leakage of light through a PN gap in the semiconductor light emitting device shown in FIG. 31.
Figure 33:
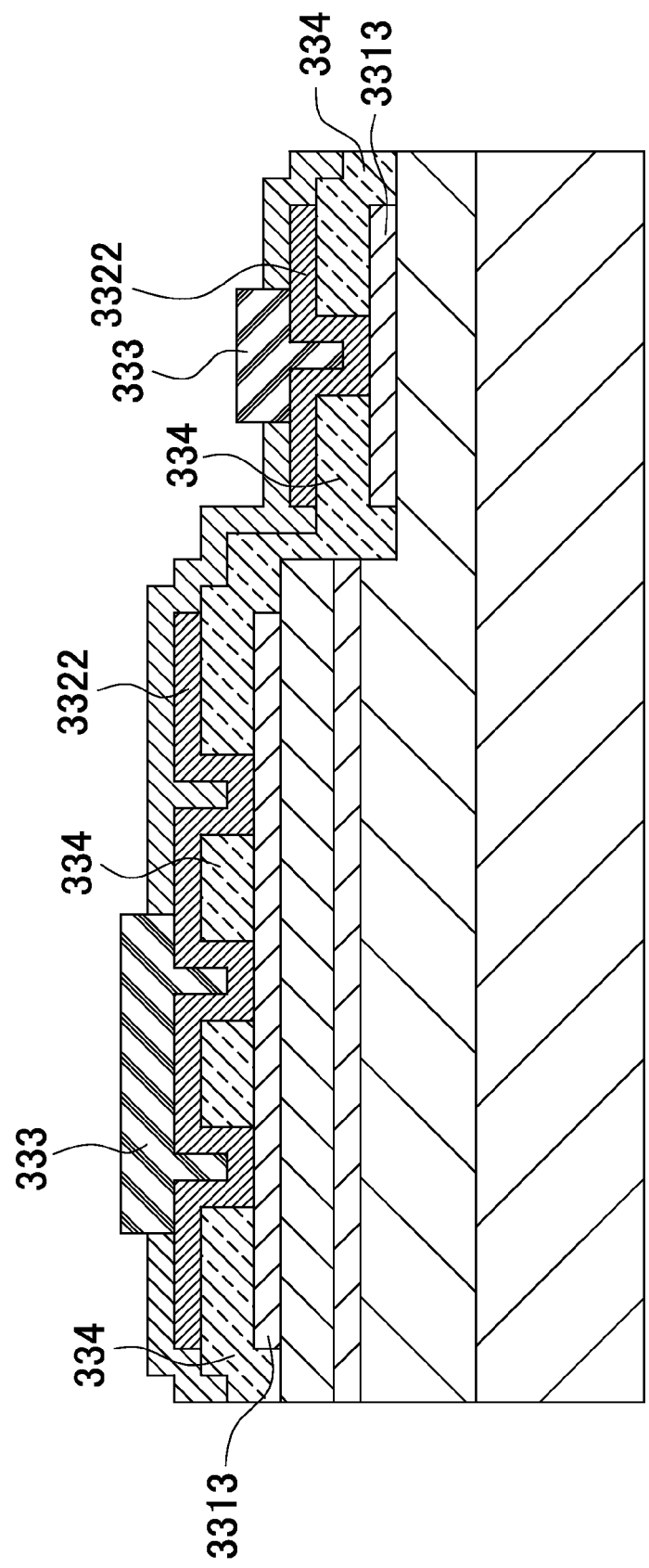
FIG. 33 is a vertical sectional view showing the construction of a prototype semiconductor light emitting device that has been constructed by these inventors, and includes a reflecting film directly arranged on ITO.

The characteristics of the semiconductor light emitting device shown in FIG. 5 are compared with a light emitting device as a comparative example that has a structure shown in FIG. 31. FIG. 8 is a graph showing the comparison between the semiconductor light emitting device shown in FIG. 5 and the light emitting device according to the comparative example in light output power and forward voltage. According to this graph, it can be seen that the light output power of the semiconductor light emitting device shown in FIG. 5 is increased, while the forward voltage of the semiconductor light emitting device shown in FIG. 5 is reduced. From this comparison, it can be found that the construction of the semiconductor light emitting device according to the second embodiment has advantages.

Third Embodiment

Figure 9:
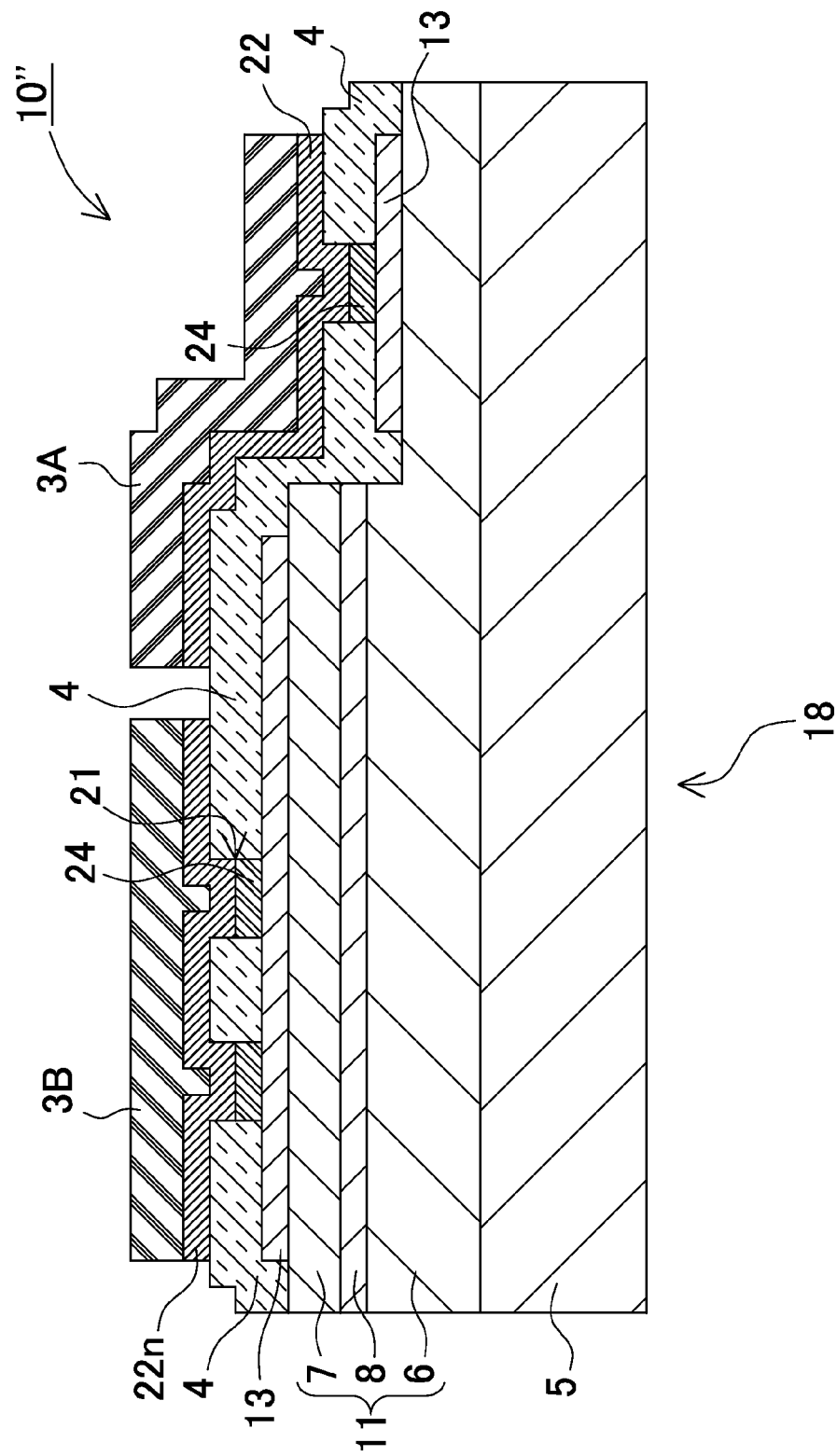
FIG. 9 is a cross-sectional view showing a semiconductor light emitting device according to a third embodiment.
Figure 10:
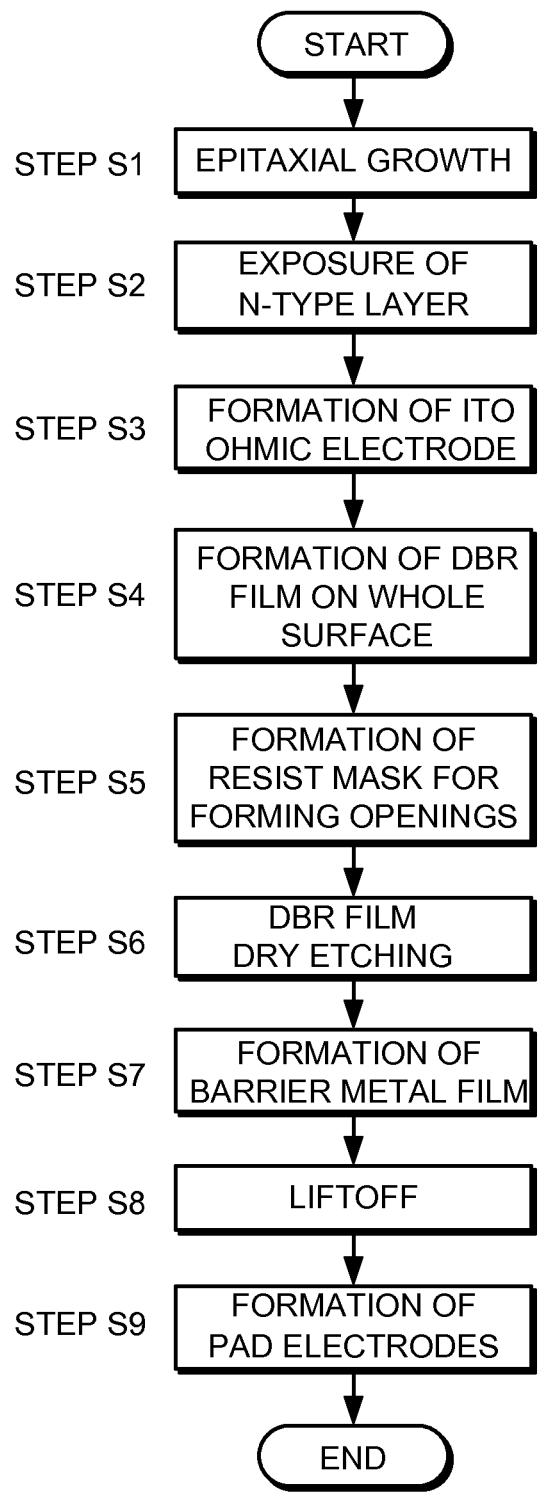
FIG. 10 is a flowchart showing the production method of the semiconductor light emitting device shown in FIG. 9.
Figure 11A:
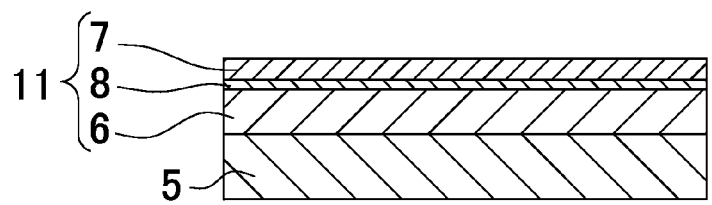
FIGS. 11A to 11E are cross-sectional views showing the production processes of the semiconductor light emitting device shown in FIG. 9.
Figure 11B:
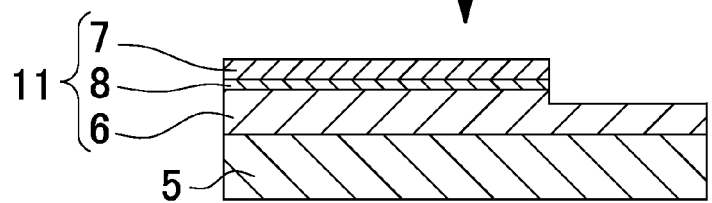
Figure 11C:
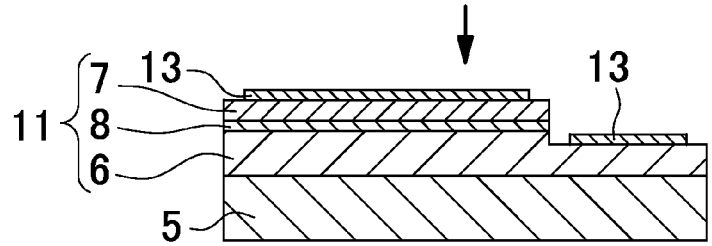
Figure 11D:
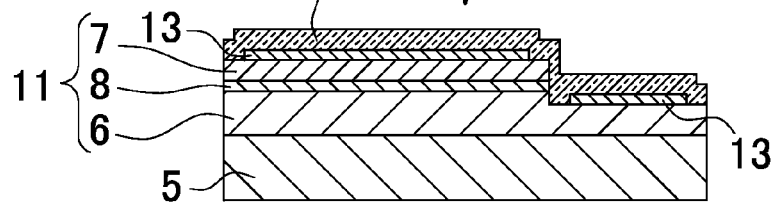
Figure 11E:
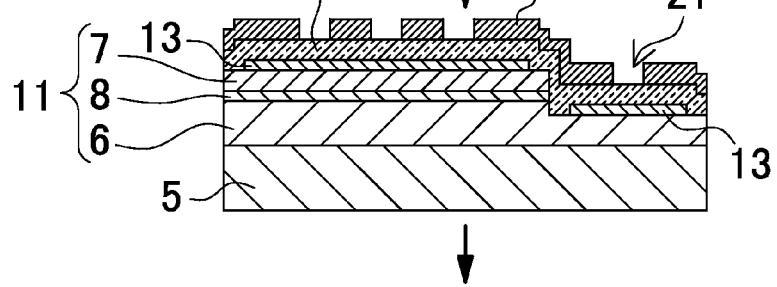
Figure 12F:
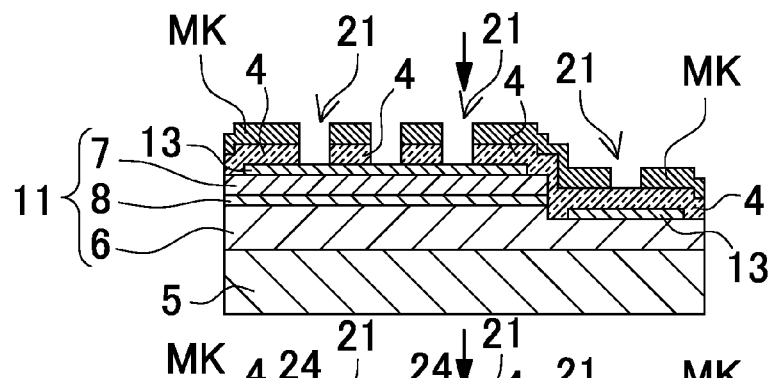
FIGS. 12F to 12I are cross-sectional views showing the production processes of the semiconductor light emitting device shown in FIG. 9.
Figure 12G:
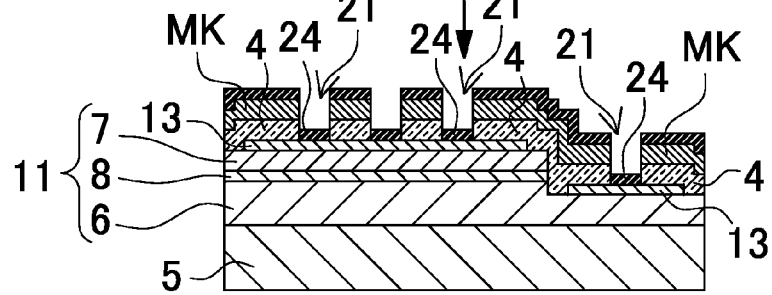
Figure 12H:
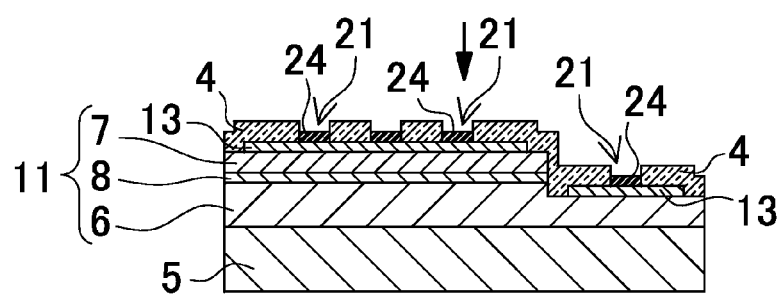
Figure 12I:
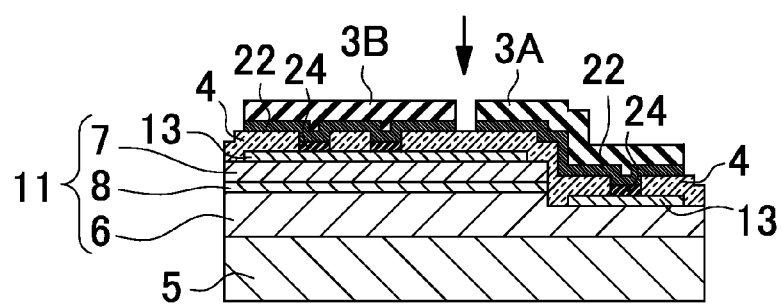

The semiconductor light emitting device can have a gap between the pad electrodes, which are provided for external connection. FIG. 9 shows this type of semiconductor light emitting device 10" according to a third embodiment. The production method of the semiconductor light emitting device according to the third embodiment is now described with reference to a flowchart of FIG. 10, and cross-sectional views of FIGS. 11A to 11E and 12F to 12I. The cross-sectional views show a die for ease of illustration. Illustration of the dividing process is omitted which divides a wafer into chips after wafer processes for the sake of brevity. Main processes can be shown as follows:

Step S1: Epitaxial Growth
Step S2: Exposure of N-Type Layer
Step S3: Formation of ITO Ohmic Electrode
Step S4: Formation of DBR Film on Whole Surface
Step S5: Formation of Resist Mask for Forming Openings
Step S6: DBR Film Dry Etching
Step S7: Formation of Barrier Metal Film
Step S8: Liftoff
Step S7: Formation of Pad Electrodes A GaN layer is first grown as shown in FIG. 11A. A mask such as SiO₂ and resist is formed on the GaN layer, and the n-type semiconductor layer 6 as n-type contact layer is exposed by RIE, or the like, as shown in FIG. 11B. After removing the RIE mask, the ITO electrode film as the transparent electrically-conducting layer 13 is formed into a pattern as shown in FIG. 11C. The ITO electrode film can be formed by vapor deposition, sputtering, or the like. Etching or liftoff can be suitably selected in the patterning. Subsequently, the dielectric film 4 is formed on the whole surface (including both upper and side surfaces of the semiconductor structure 11) as shown in FIG. 11D. The dielectric film 4 can be formed by sputtering, vapor deposition, or the like. After the dielectric film 4 is formed, a mask MK that has the openings 21 corresponding to electrical connection parts is formed by using a photoresist as shown in FIG. 11E. The dielectric film 4 is etched as shown in FIG. 12F. Wet etching, and RIE, which is dry etching, can be suitably selected in in the dielectric film etching. In the case where the dielectric film 4 is tapered in the etching, the mask can be easily lifted off in the later process. After dry etching, the mask MK is not removed but remains so that the barrier layer 24 is formed by liftoff as shown in FIG. 12G. It is preferable that the barrier layer 24 be formed of a metal that has a high work function (e.g., Au, Rh, Pt, Pd, Au, Ag, etc.). The reason is to prevent reaction of the barrier layer with the ITO electrode. After the barrier layer 24 is formed in the openings 21, the mask MK is removed as shown in FIG. 12H. Subsequently, the metal reflecting layer 22 formed of Al or an alloy of Al, and the pad electrodes 3A and 3B for external connection are formed as shown in FIG. 12I.

According to the above processes, since the mask MK for forming the barrier layer 24 can be also used as the mask MK for forming the openings 21 in the dielectric film 4, the number of production processes can be reduced. Also, since a process for positioning the barrier layer 24 in the opening 21 is not required in the formation of barrier layer 24, the barrier layer 24 can be accurately arranged in the opening 21.

Fourth Embodiment

Figure 13:
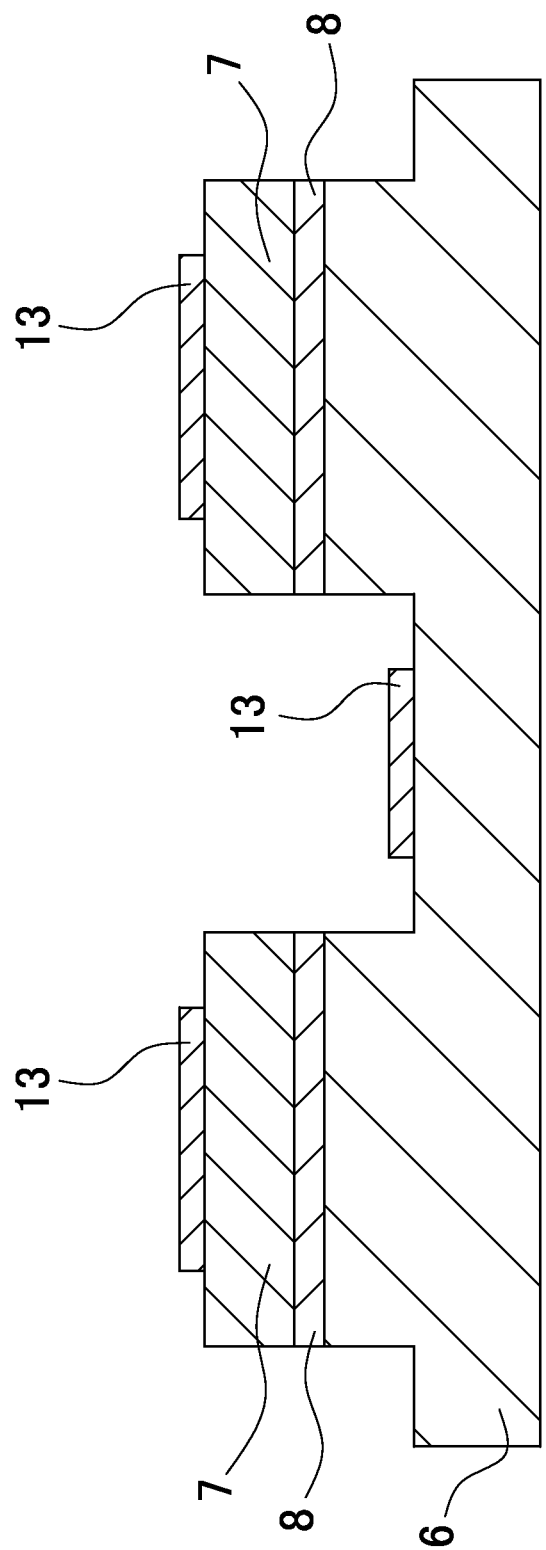
FIG. 13 is a cross-sectional view showing a semiconductor light emitting device according to a fourth embodiment.
Figure 14:
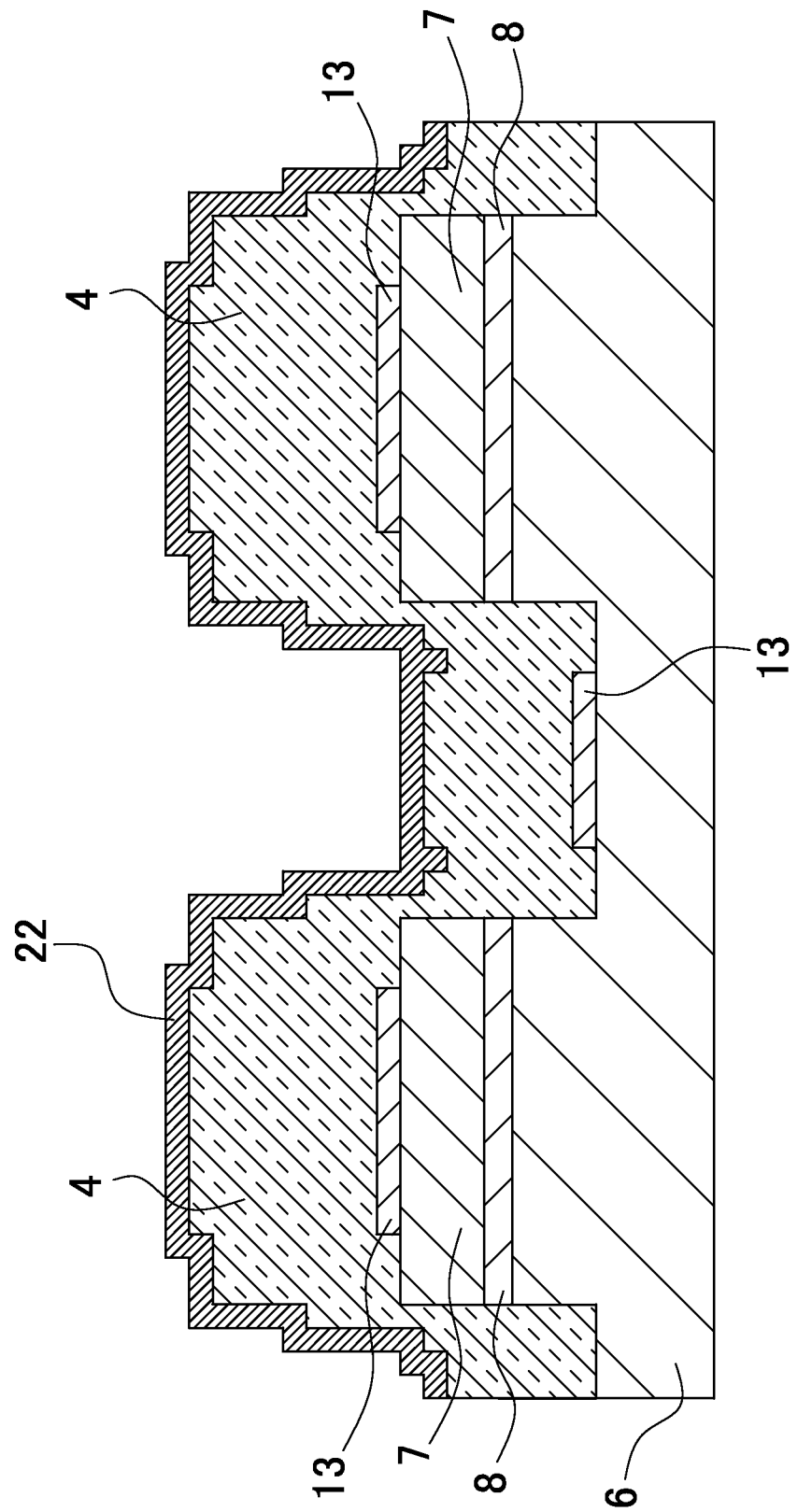
FIG. 14 is a cross-sectional view showing the semiconductor light emitting device according to the fourth embodiment.
Figure 15:
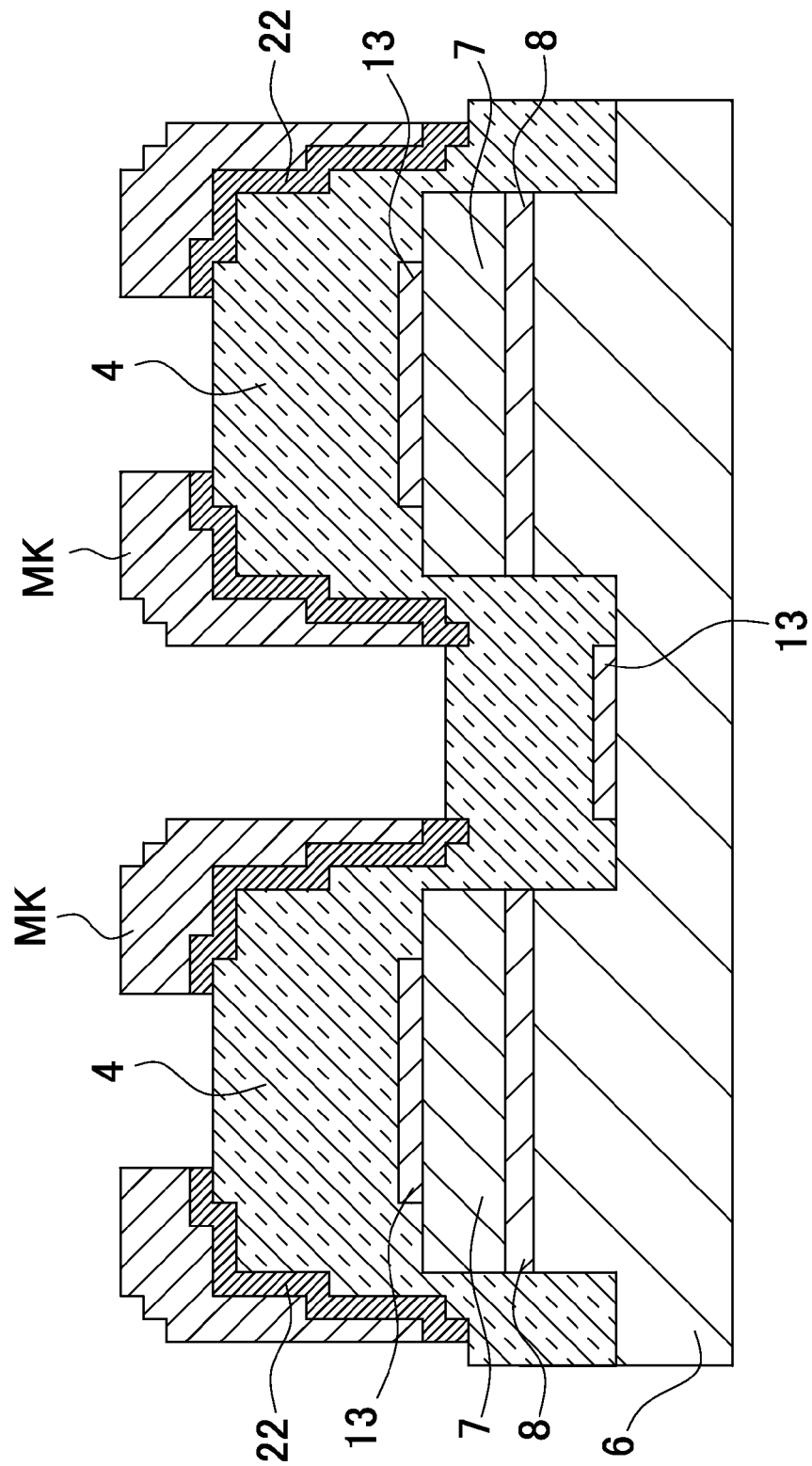
FIG. 15 is a cross-sectional view showing the semiconductor light emitting device according to the fourth embodiment.
Figure 16:
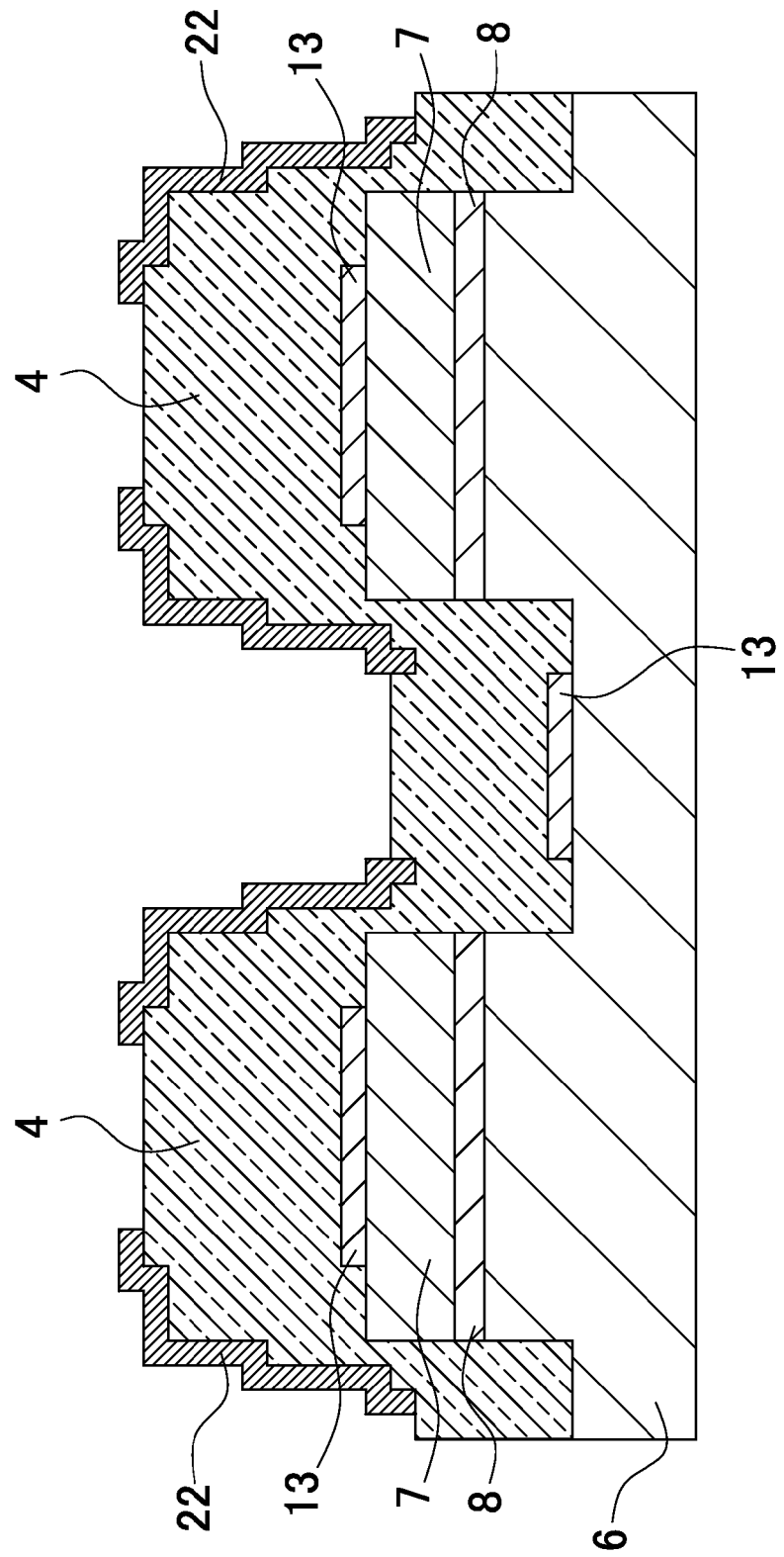
FIG. 16 is a cross-sectional view showing the semiconductor light emitting device according to the fourth embodiment.
Figure 17:
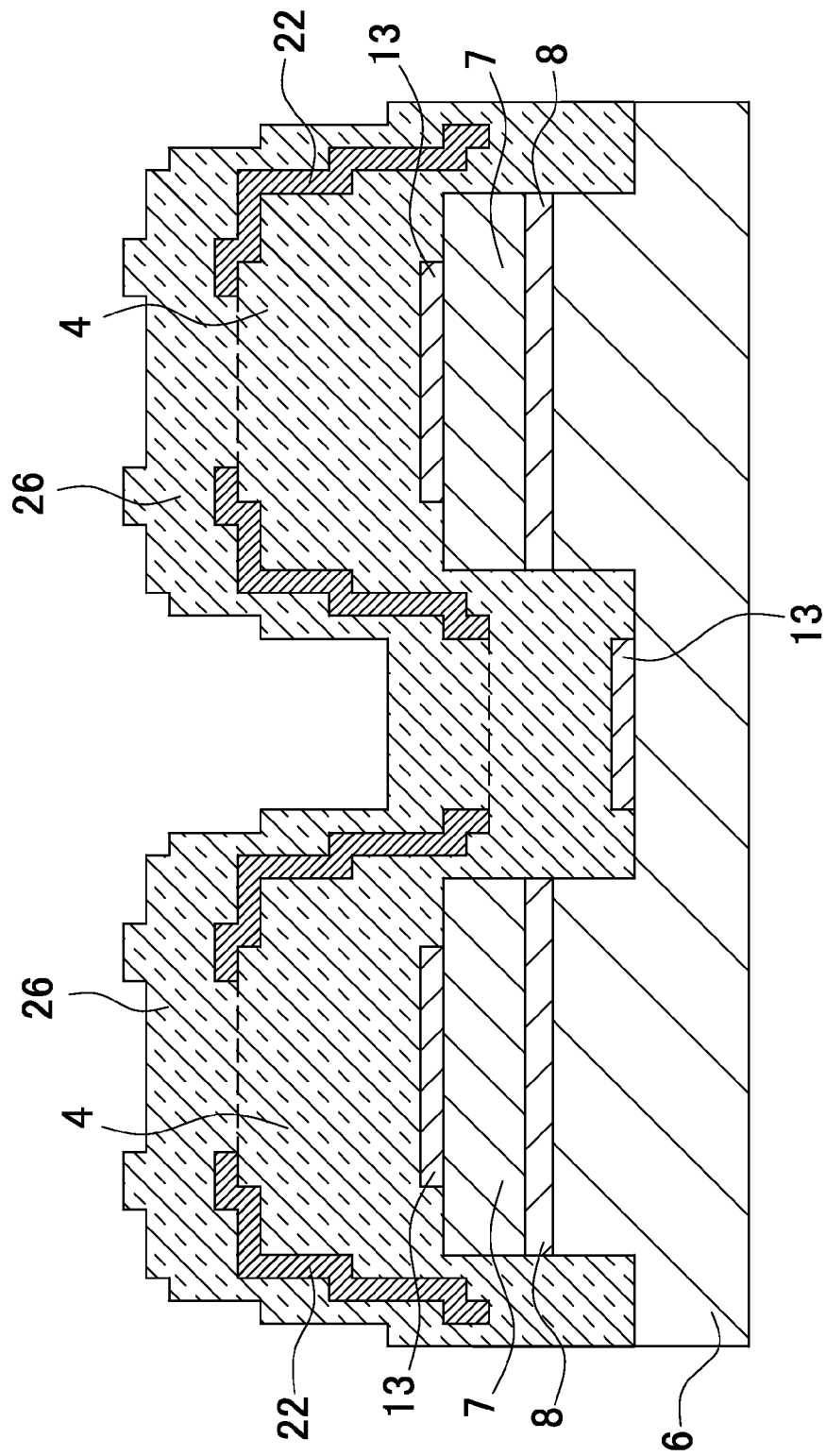
FIG. 17 is a cross-sectional view showing the semiconductor light emitting device according to the fourth embodiment.
Figure 18:
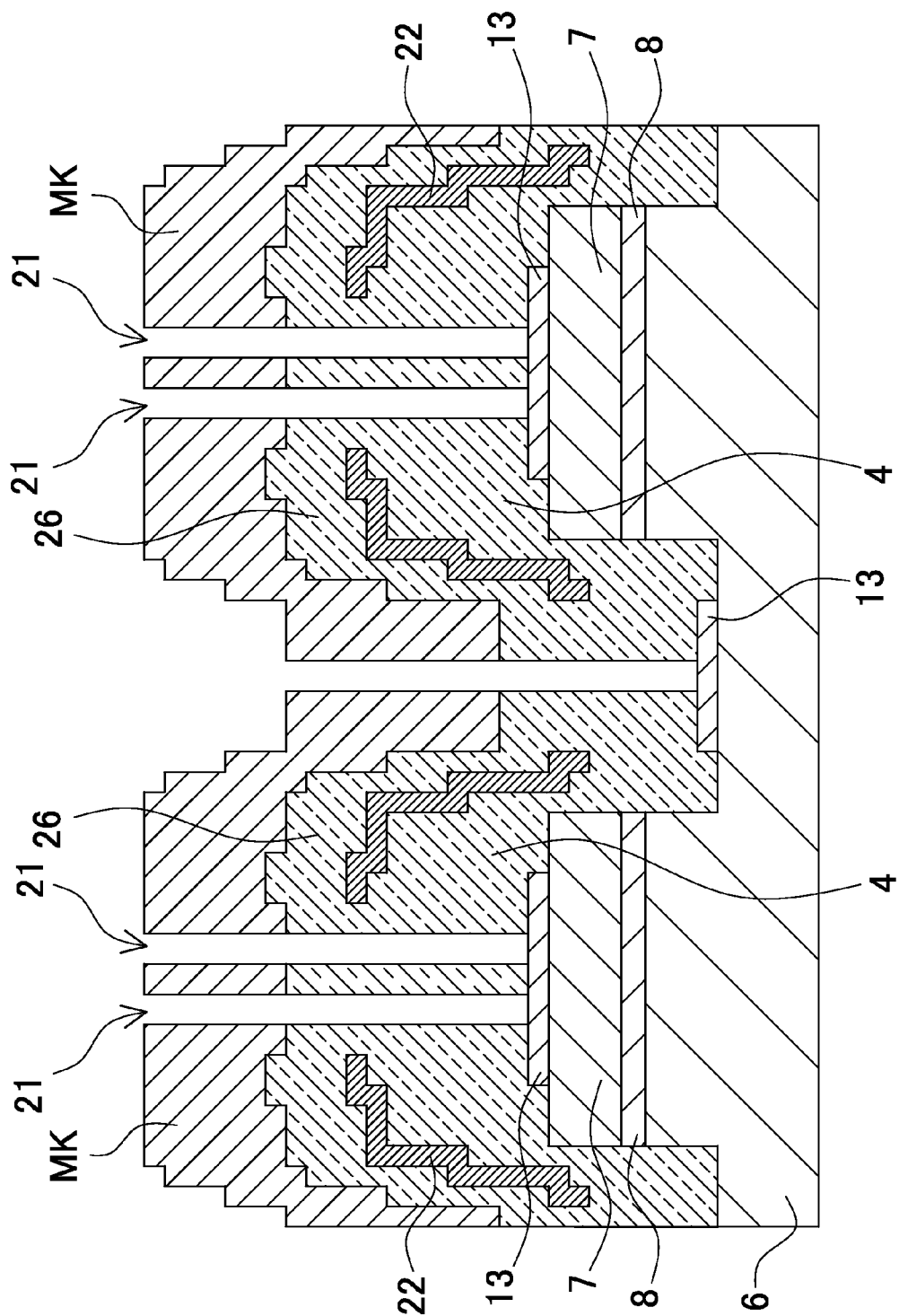
FIG. 18 is a cross-sectional view showing the semiconductor light emitting device according to the fourth embodiment.
Figure 19:
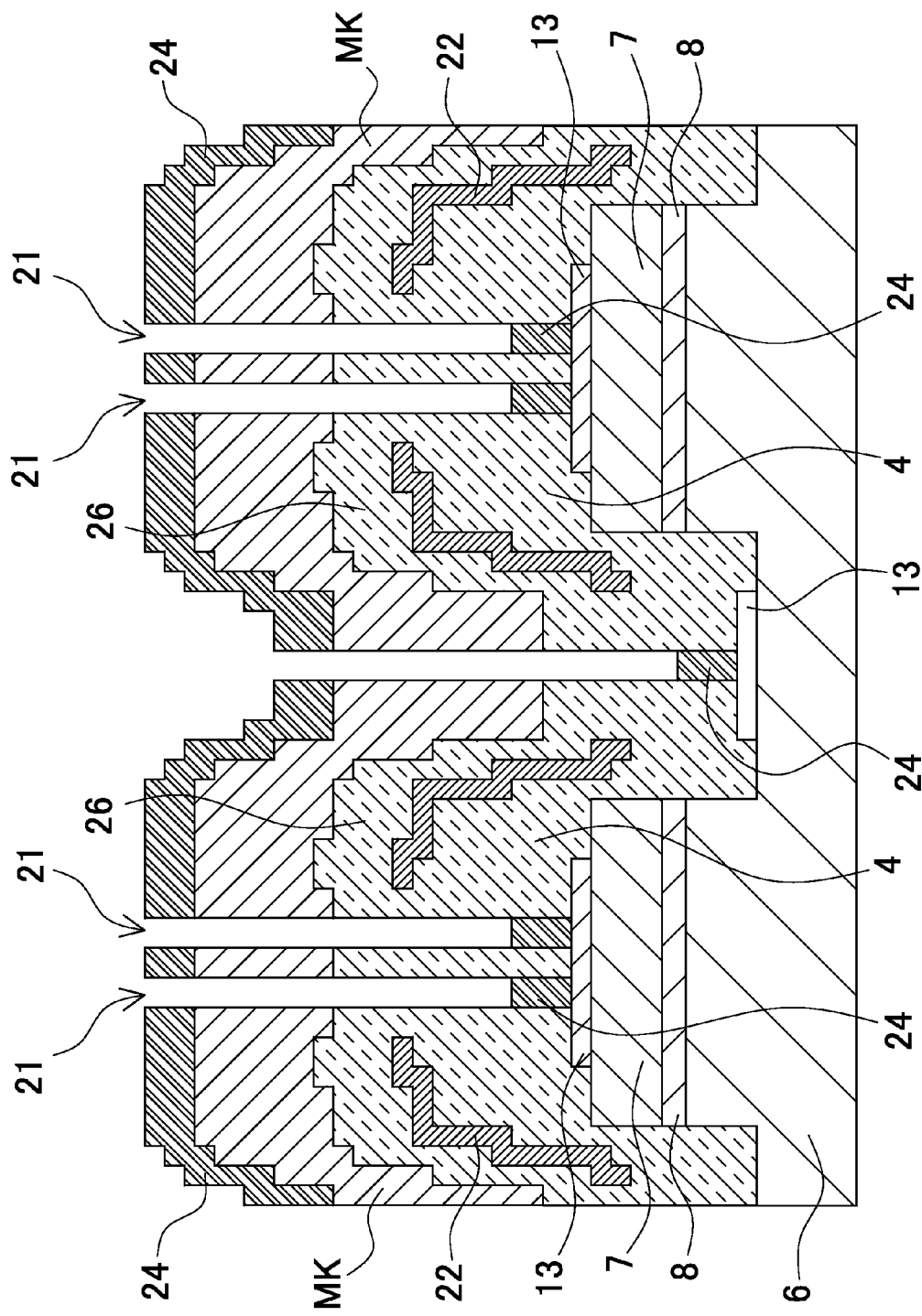
FIG. 19 is a cross-sectional view showing the semiconductor light emitting device according to the fourth embodiment.
Figure 20:
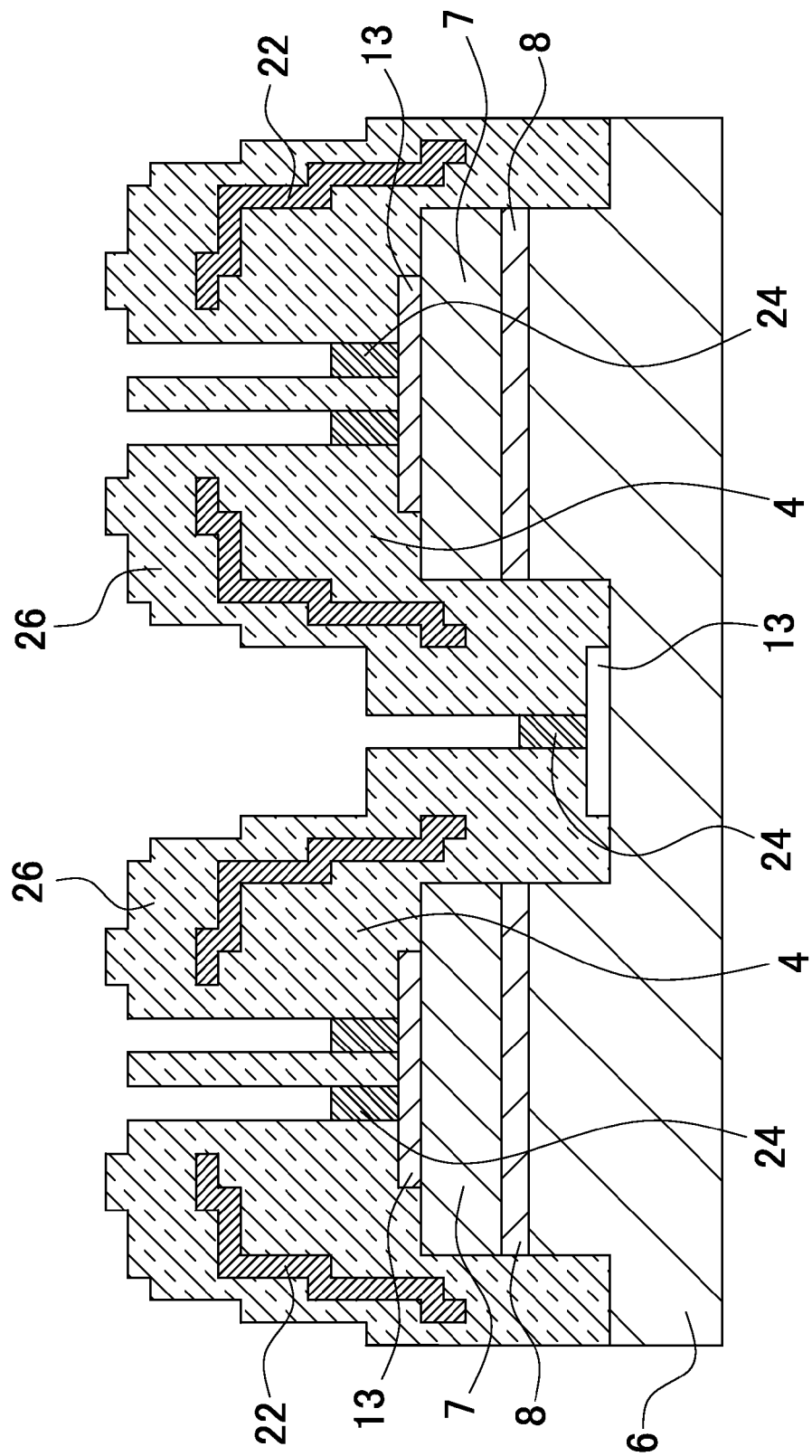
FIG. 20 is a cross-sectional view showing the semiconductor light emitting device according to the fourth embodiment.
Figure 21:
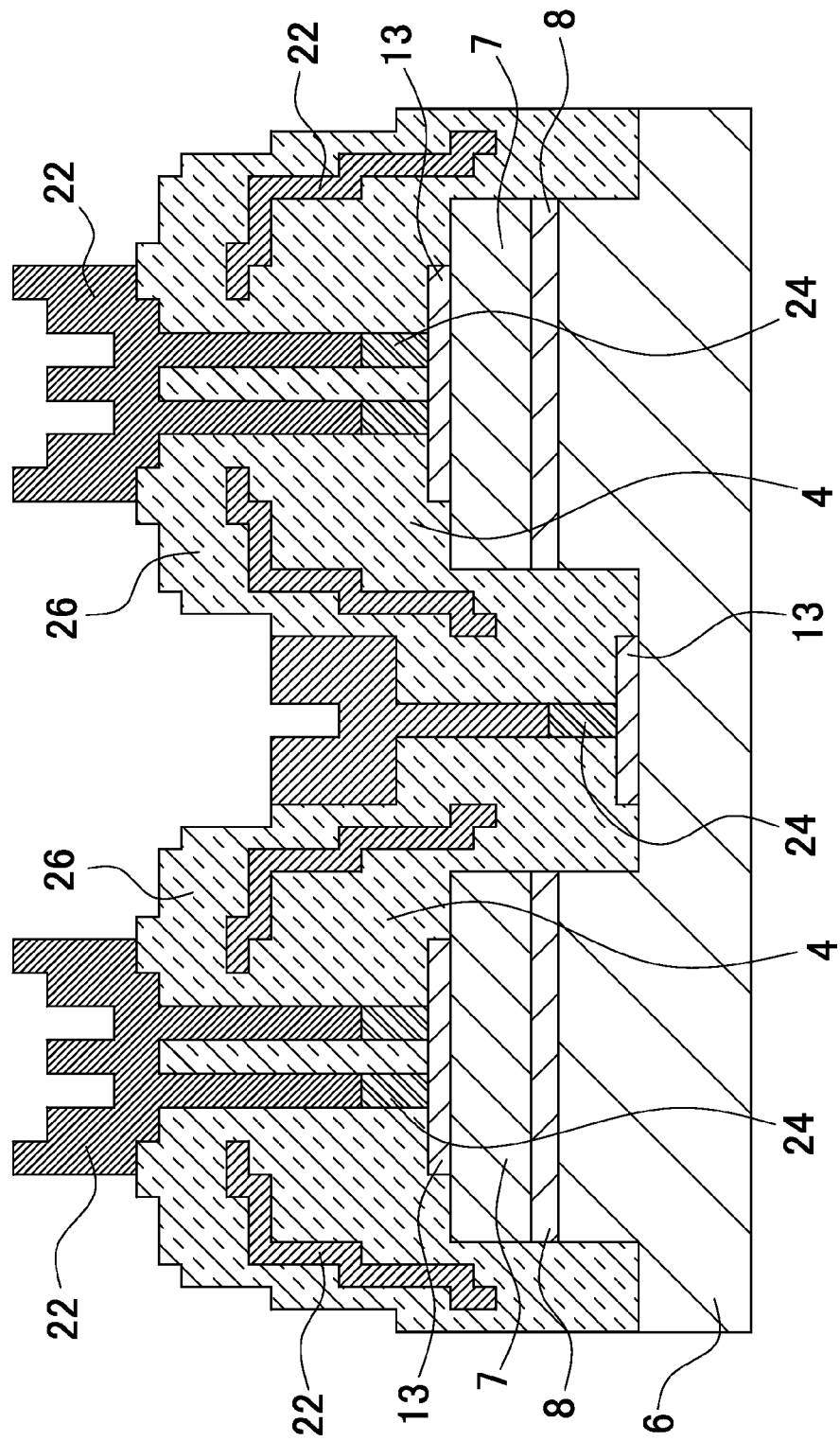
FIG. 21 is a cross-sectional view showing the semiconductor light emitting device according to the fourth embodiment.

FIGS. 13 to 21 are cross-sectional views showing production processes of a semiconductor light emitting device (shown in the cross-sectional view of FIG. 21) according to a fourth embodiment. After the semiconductor structure 11 is first epitaxially grown, the GaN layer in the n-type semiconductor layer 6 is etched, and exposed as shown in FIG. 13. Subsequently, the ITO film is formed as the transparent electrically-conducting layer 13. Subsequently, the dielectric film 4 (DBR) is formed, and an Al layer is formed as the metal reflecting layer 22 as shown in FIG. 14. Subsequently, a resist layer is formed as the mask MK by photolithography or the like so that the surface of the metal reflecting layer 22 is covered, and the metal reflecting layer 22 is etched as shown in FIG. 15. The resist layer is removed in FIG. 16. The electrically insulating film is formed as shown in FIG. 17. After a resist layer is formed by photolithography or the like, the electrically insulating film and the dielectric film 4 are etched as shown in FIG. 18. The barrier layer 24 is formed as shown in FIG. 19. The resist layer is removed (lifted off) as shown in FIG. 20. Finally, an Al layer is formed as the pad electrodes on the upper surfaces of the barrier layer 24, and the resist layer is removed (lifted off) as shown in FIG. 21. Thus, the semiconductor light emitting device according to the fourth embodiment is produced.

Fifth Embodiment

Figure 22:
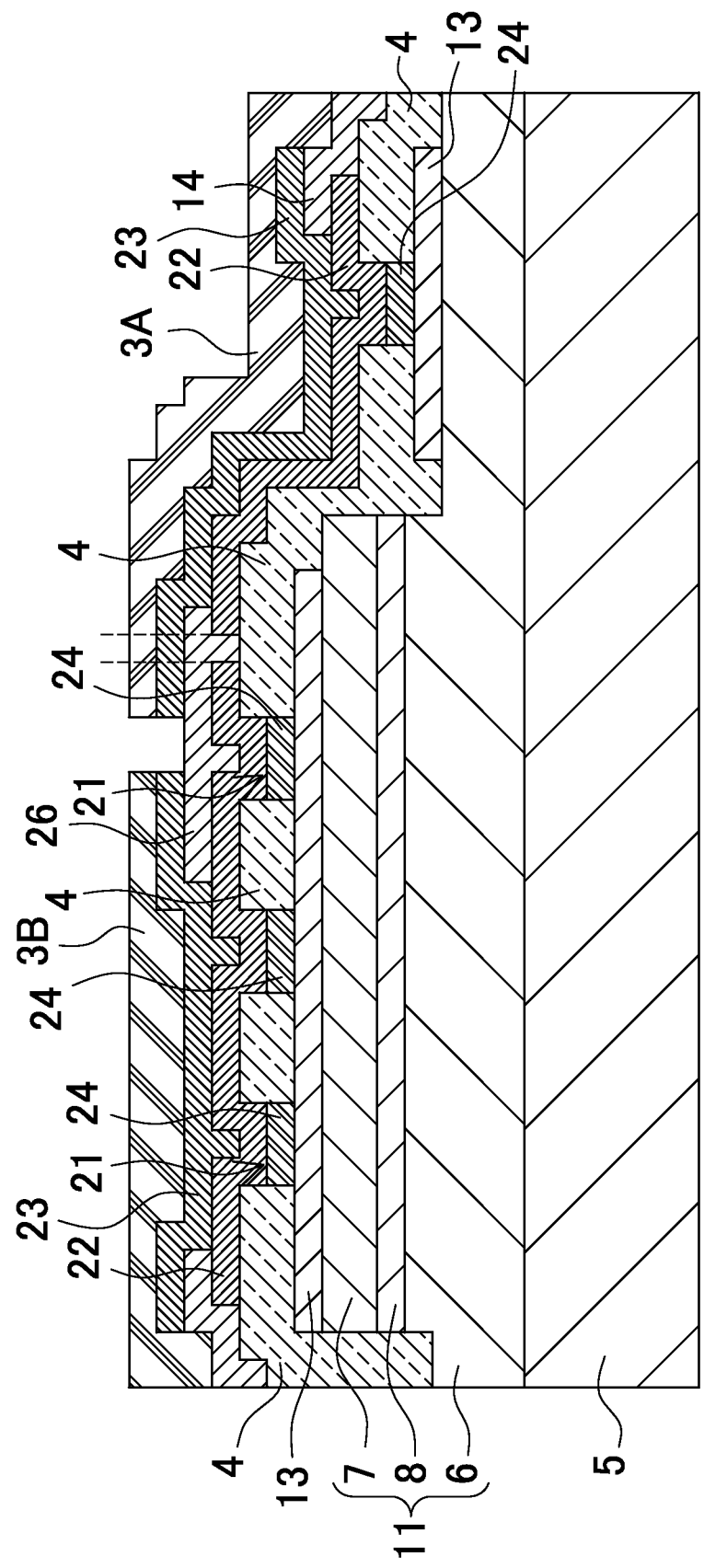
FIG. 22 is a cross-sectional view showing a semiconductor light emitting device according to a fifth embodiment.

An Al reflecting film with larger area can be arranged. FIG. 22 is a cross-sectional view showing this type of semiconductor light emitting device according to a fifth embodiment. According to the construction shown in FIG. 22, the Al reflecting film has a multilevel structure so that the gap between Al reflecting film parts is eliminated. Accordingly, it is possible to suppress leakage of light. Therefore, the semiconductor light emitting device according to a fifth embodiment is advantageous in light output power.

Figure 23:
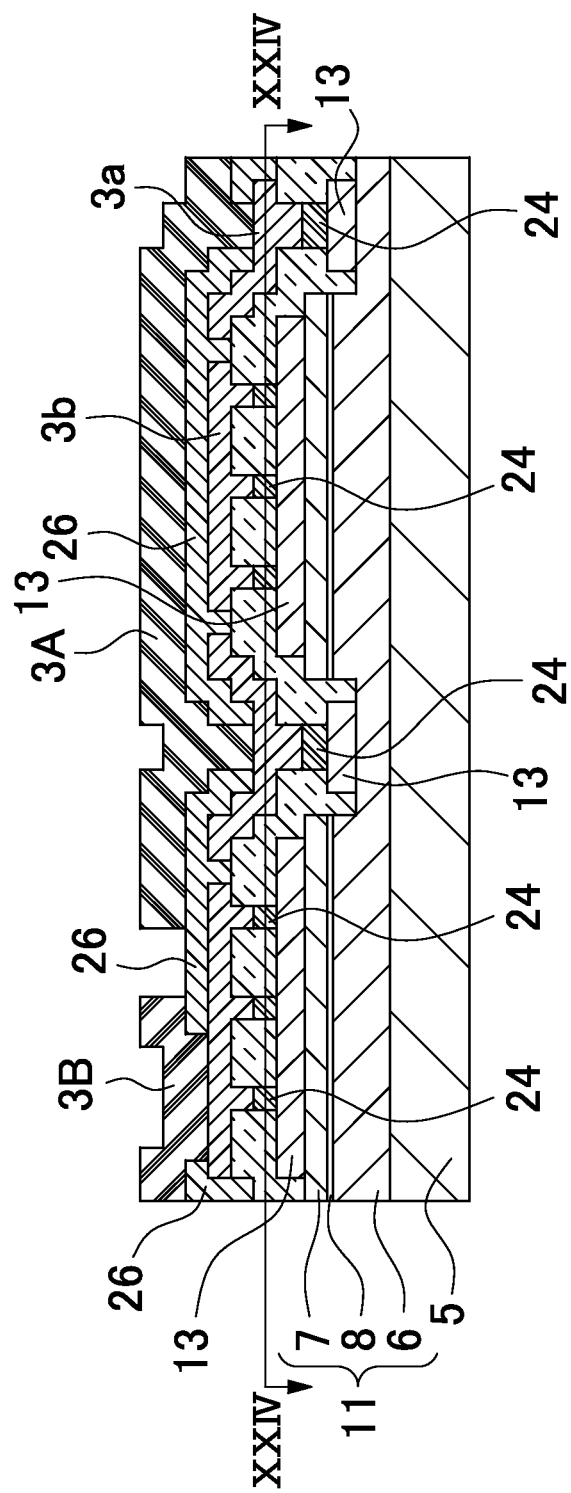
FIG. 23 is a cross-sectional view showing a semiconductor light emitting device according to a sixth embodiment.

Sixth Embodiment (Eutectic Bonding)
Eutectic bonding can be applied to the semiconductor light emitting device according to the present invention. FIG. 23 is a cross-sectional view showing this type of semiconductor light emitting device according to a sixth embodiment. In this illustrated light emitting device, after the n-type layer is formed on the growth substrate 5, the n-type layer is partially etched and exposed. Subsequently, the ITO layer is formed as the transparent electrically-conducting layer 13. After that, the DBR and the barrier layer 24 are formed. After the metal reflecting layer 22 is formed, the electrode-insulating film 26 is formed. Finally, the eutectic-bonding pad electrodes are formed.

Figure 24:
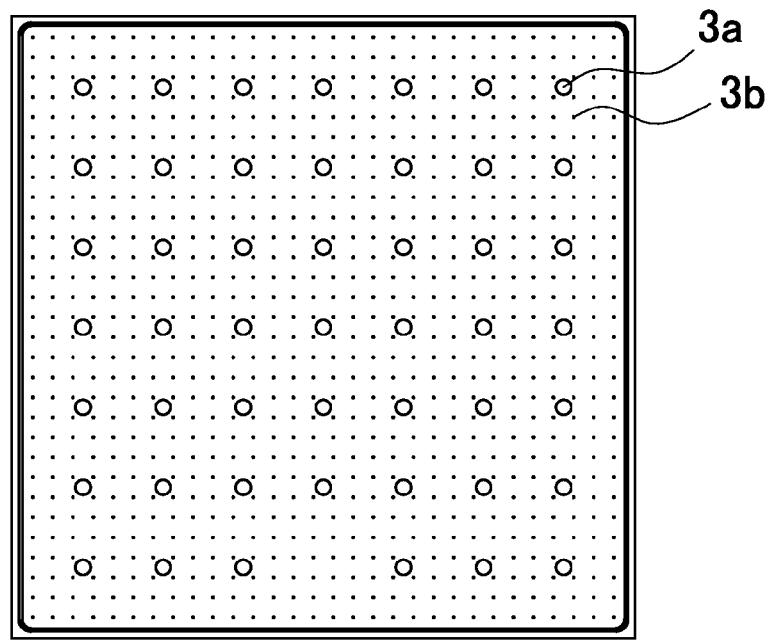
FIG. 24 is a horizontal cross-sectional view of the light emitting device shown in FIG. 23 taken along the line XXIV-XXIV.

(N-Side Electrode 3a)
It is preferable that the n-side electrodes 3a be small and be dispersedly arranged. The n-side electrodes 3a are connected to the n-side pad electrode 3A. Accordingly, the area of the electrode can be large. As a result, it is possible to provide a device that has good heat dissipating performance and can be easily mounted. FIG. 24 is a horizontal cross-sectional view showing the light emitting device that has exemplary dispersed n-side electrodes. Since the illustrated n-side electrode 3a is small, it is possible to suppress that emitted light is absorbed by the n-side electrode 3a. As a result, it is possible to increase the light extraction efficiency. Since the small n-side electrodes 3a are dispersedly arranged (distributed), the electrical resistance is reduced so that Vf can be reduced. Additionally, the linearity can be also improved. In addition, since the n-side electrodes 3a, which absorb emitted light, are dispersedly arranged, the distribution of light emission can be even. The term "n-side electrodes 3a are dispersedly arranged" includes that a plurality of n-side electrodes 3a are dispersedly arranged in a cluster, and that a plurality of n-side electrodes 3a are dispersedly arranged and but does not compose a cluster.

Seventh Embodiment (Multilevel Structure)
(Electrode-Insulating Film 26)

Figure 25:
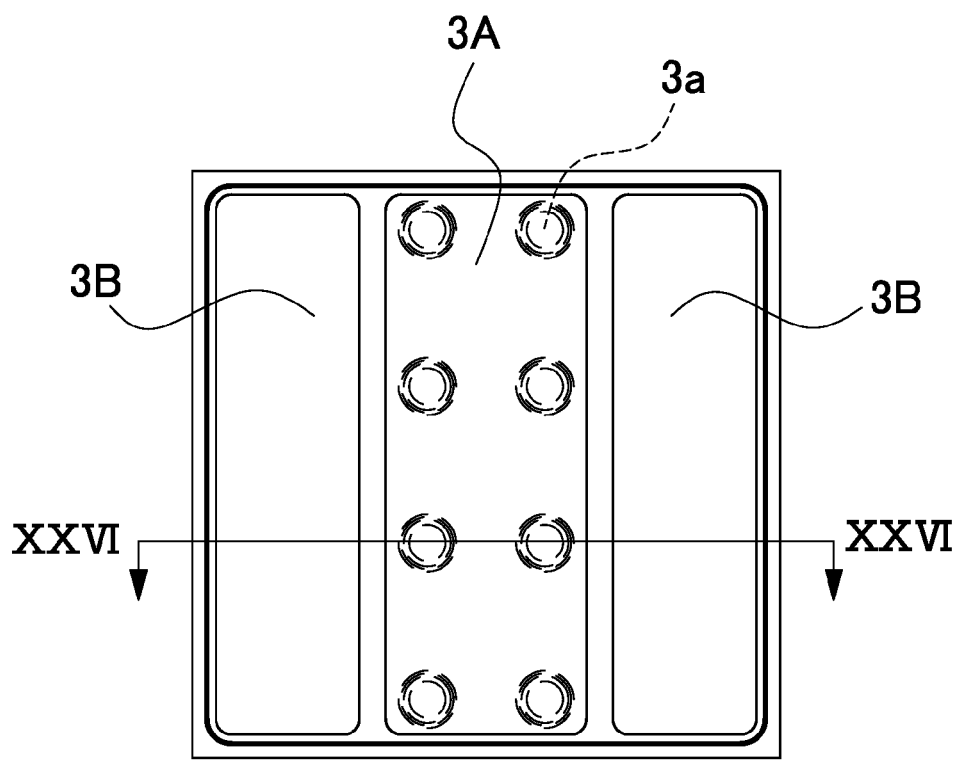
FIG. 25 is a plan view schematically showing a light emitting device according to a seventh embodiment.
Figure 26:
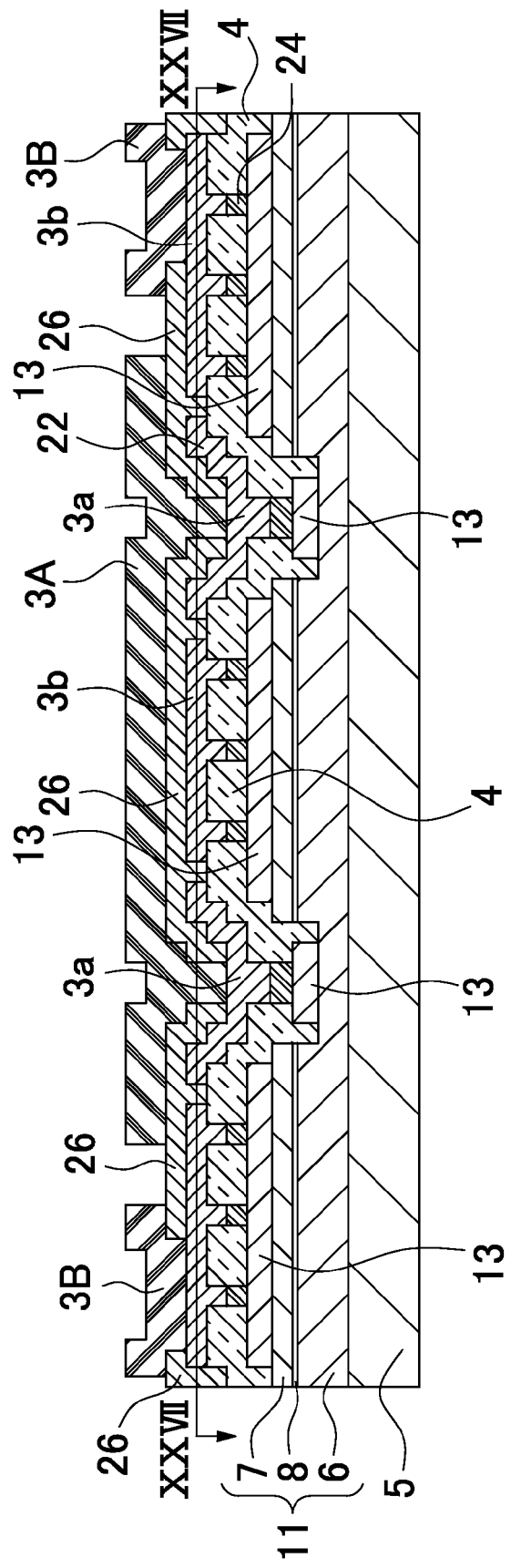
FIG. 26 is a vertical cross-sectional view of the light emitting device shown in FIG. 25 taken along the line XXVI-XXVI.

A multilevel structure can be applied to the semiconductor light emitting device according to the present invention. FIGS. 25 and 26 show this type of light emitting device according to a seventh embodiment that includes the multilevel structure. FIG. 25 is a plan view showing this light emitting device. FIG. 26 is a vertical cross-sectional view showing this light emitting device taken along the line XXVI-XXVI in FIG. 25. In the multilevel structure, after the p-side electrode 3b and the n-side electrode 3a are covered by the electrode-insulating film 26, the p-side pad electrode 3B and the n-side pad electrode 3A are formed so that the p-side pad electrode 3B and the n-side pad electrode 3A can be connected through electrical connection windows that are opened in this electrode covering film to the p-side electrode 3b and the n-side electrode 3a, respectively. According to this construction, even in the case where the pad electrodes are formed large, since the lower surfaces of the pad electrodes are electrically insulated by the electrode-insulating film 26, a short circuit will not occur. For this reason, the area of the pad electrode can be large. Also, it is possible to surely provide an enough area for eutectic bonding to fix and electrically connect the pad electrode. For example, in the light emitting device shown in the cross-sectional view of FIG. 26, the n-side electrodes 3a can be connected to the large n-side pad electrode through the openings in the electrode-insulating film 26. Accordingly, it is possible to provide a large area for eutectic bonding. As a result, it is possible to improve the reliability of eutectic bonding. Therefore, the light emitting device can be stably mounted. Mounting manner other than the eutectic boding can be used. For example, in the case of ultrasonic bonding using Au stud bumps, the number of the bumps can be increased so that heat dissipation can be improved. As a result, a large current can be applied. Current tends to locally flow through the PN gap. For this reason, when stud bumps are formed on the n-side pad electrode 3A, the stud bumps are surrounded by a plurality of n-side electrodes 3a. In this case, heat dissipation can be further improved.

In this illustrated light emitting device, after the n-type layer is formed on the growth substrate 5, the n-type layer is partially etched and exposed. Subsequently, the ITO layer is formed. After that, similar to the light emitting device shown in FIG. 23, the DBR and the barrier layer 24 are formed. After the metal reflecting layer 22 is formed, the electrode-insulating film 26 is formed. Finally, the eutectic pad electrodes are formed. According to this embodiment, since the multilevel structure is adopted so that the n-side electrode overlaps the p-side electrode, the area of the n-side pad electrode 3A can be large as shown in FIG. 25. If the n-side pad electrode does not overlap the p-side electrode, the n-side electrode will be small, in other words, the area of the n-side pad electrode will correspond to the n-side electrode 3a. In this embodiment, since the area of the electrode can be large, the light emitting device according to this embodiment is advantageous in eutectic bonding.

In addition, since the multilevel structure is adopted so that the dielectric film 4 serves as a film for electrically insulating layers from each other, it is possible to minimize the exposed area of the n-type contact layer, which does not correspond the light emission are, and to surely provide a bonding area required for the flip-chip mounting process.

Eighth Embodiment

Figure 27:
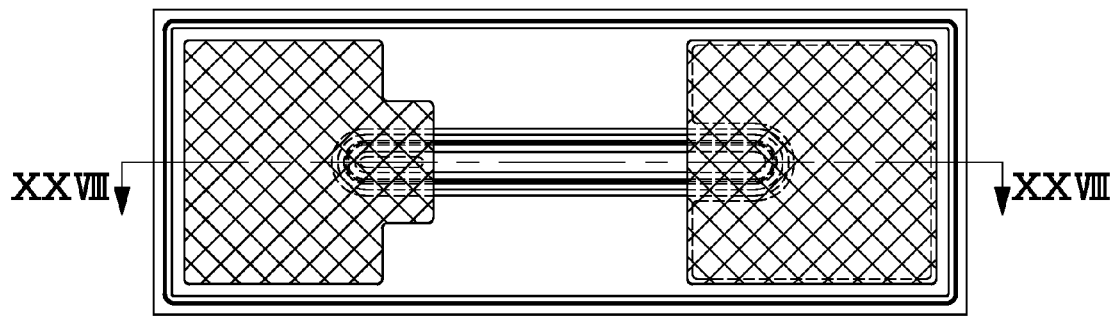
FIG. 27 is a plan view schematically showing a light emitting device according to an eighth embodiment.
Figure 28:
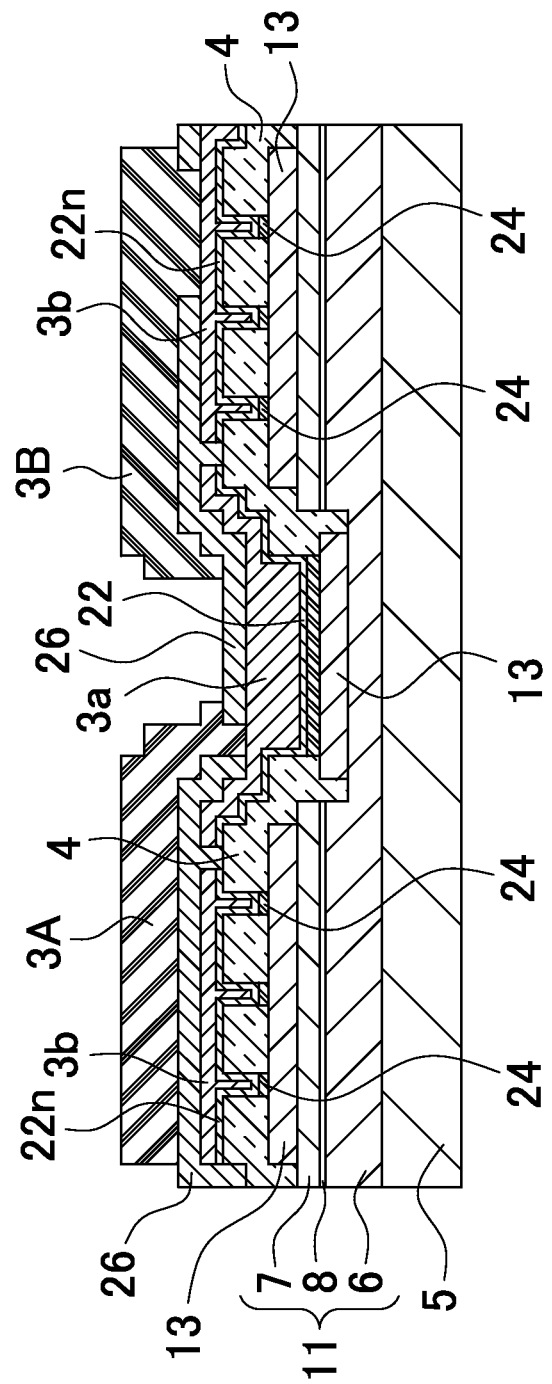
FIG. 28 is a cross-sectional view of the light emitting device shown in FIG. 27 taken along the line XXVIII-XXVIII.
Figure 29A:
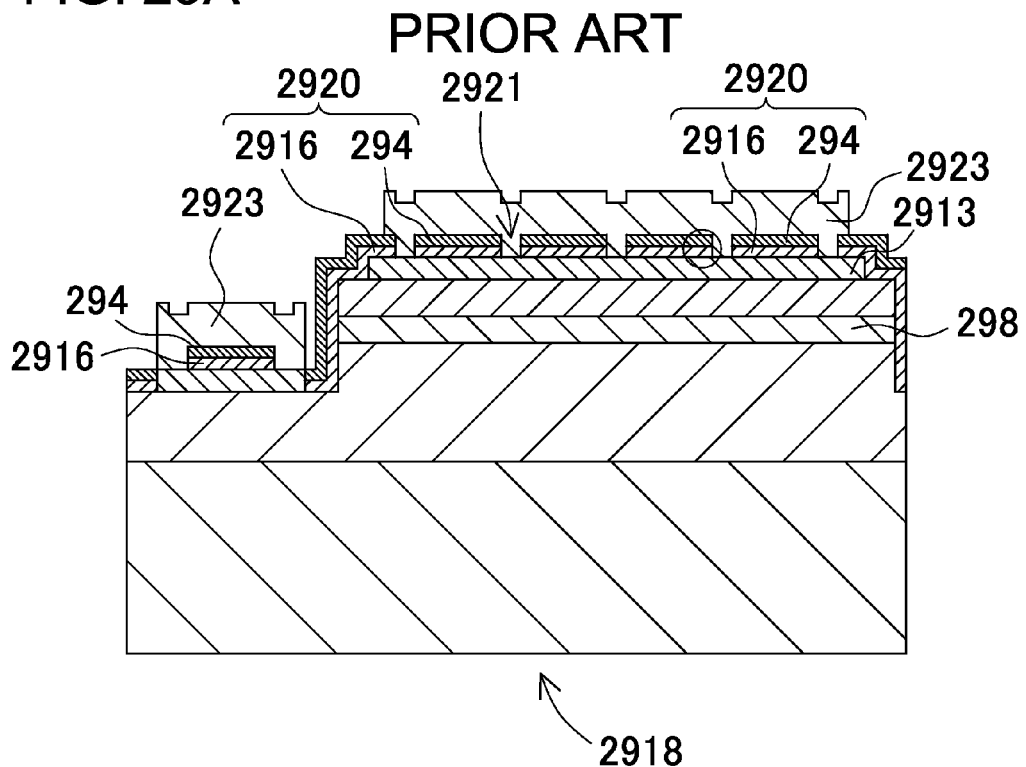
FIG. 29A is a cross-sectional view showing a known semiconductor light emitting device.
Figure 29B:
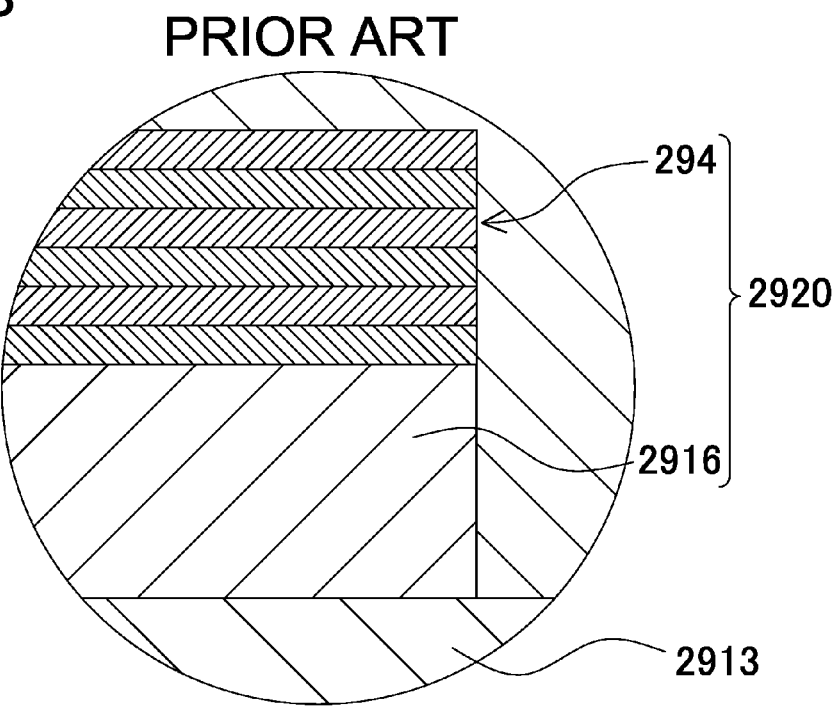
FIG. 29B is an enlarged cross-sectional view showing a part of the semiconductor light emitting device enclosed by the circle in FIG. 29A.

FIGS. 27 and 28 show a semiconductor light emitting device according to an eighth embodiment. FIG. 27 is a plan view showing this light emitting device. FIG. 28 is a cross-sectional view showing this light emitting device taken along the line XXVIII-XXVIII in FIG. 27. Although the light emitting device has not a square shape but a rectangular shape as shown this plan view, the multilevel structure can provide a large area of the electrode. As a result, the light emitting device according to this embodiment can be advantageous in eutectic bonding.

(Electrode-Insulating Film 26)

The side surface of the semiconductor structure 11 is covered by the metal reflecting layer 22. The metal reflecting layer 22, which covers the side surface of the semiconductor structure 11, covers the n-type semiconductor layer 6. The metal reflecting layer 22 is separated from the second metal reflecting layer 22n that covers the p-type semiconductor layer 7. In other words, the metal reflecting layer 22 is disconnected from the second metal reflecting layer 22n. The electrode-insulating film 26 is arranged on the upper surface of the metal reflecting layer 22, which covers the side surface of the semiconductor structure 11. The electrode-insulating film 26 extends and covers a spaced part between the metal reflecting layer 22 and the second metal reflecting layer 22n. The n-side and p-side pad electrodes are arranged on the upper surface of this electrode-insulating film 26, and are spaced away from each other. According to this construction, since the n-side and p-side electrodes 3a and 3b are connected to the n-side and p-side pad electrodes in the multilevel structure, the area of the pad electrode can be larger. As a result, the light emitting device according to this embodiment can be advantageous in eutectic bonding. Since the multilevel structure is adopted so that the dielectric film 4 serves as a film for electrically insulating layers from each other, it is possible to prevent that the electrode cuts off light. As a result, it is possible to further increase the light extraction efficiency.

INDUSTRIAL APPLICABILITY

A light emitting device according to the present invention can be applied to a lighting light source, an LED display, a back light source, a signal light, an illuminated switch, various types of sensors and indicators, and the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2011-189,889 filed in Japan on Aug. 31, 2011 and Application No. 2012-168,944 filed in Japan on Jul. 30, 2012, the contents of which are incorporated herein by references.

What is claimed is:

1. A semiconductor light emitting device comprising:
   a semiconductor structure that includes an active region;
   a transparent electrically-conducting layer that is formed on or above an upper surface of said semiconductor structure;
   a dielectric film that is formed on or above an upper surface of said transparent electrically-conducting layer; and
   a metal reflecting layer that is formed on or above an upper surface of said dielectric film,
   wherein said dielectric film defines at least one opening to partially expose said transparent electrically-conducting layer therethrough, wherein said transparent electrically-conducting layer is electrically connected to said metal reflecting layer through said opening, wherein a barrier layer which is capable of preventing a deterioration of at least a part of the metal reflecting layer which faces the transparent electrically-conducting layer is partially formed covering said opening so that the barrier layer is interposed between said transparent electrically-conducting layer and the metal reflecting layer, further comprising a pad electrode is formed on or above an upper surface of said metal reflecting layer, wherein said pad electrode includes a plurality of smaller n-side electrodes that are dispersedly arranged.

2. The semiconductor light emitting device according to claim 1, wherein said dielectric film is constructed of multilayers.

3. The semiconductor light emitting device according to claim 1, wherein said metal reflecting layer is formed of aluminum or aluminum alloy.

4. The semiconductor light emitting device according to claim 1, wherein said barrier layer is formed of at least one element, or an alloy of at least one element selected from the group consisting of Au, Ag, Pt, Pd, Rh, Ir, Ru and Os.

5. The semiconductor light emitting device according to claim 1, further comprising an adhesive layer that is arranged between said barrier layer and said transparent electrically-conducting layer, and is formed of at least one metal or an alloy of at least one metal selected from the group consisting of Ti, Ni, Cr and Mo.

6. The semiconductor light emitting device according to claim 1, wherein said transparent electrically-conducting layer is formed of ITO.

7. The semiconductor light emitting device according to claim 1, wherein the film thickness of said barrier layer is thinner than said dielectric film.

8. The semiconductor light emitting device according to claim 1, wherein said barrier layer is formed only in said opening.

9. The semiconductor light emitting device according to claim 1, wherein said dielectric film is substantially entirely formed on or above the surface of said semiconductor structure.

10. The semiconductor light emitting device according to claim 1, wherein said transparent electrically-conducting layer is substantially entirely formed on or above the surface of said semiconductor structure.

11. The semiconductor light emitting device according to claim 1, wherein said dielectric film covers the side surfaces of said semiconductor structure.

12. The semiconductor light emitting device according to claim 1, wherein said metal reflecting layer covers the side surfaces of said semiconductor structure.

13. The semiconductor light emitting device according to claim 12, wherein said semiconductor structure includes n-type and p-type semiconductor layers, wherein said metal reflecting layer, which covers the side surfaces of said semiconductor structure, covers the n-type semiconductor layer, wherein said metal reflecting layer is spaced away from a second metal reflecting layer that covers the p-type semiconductor layer.

14. The semiconductor light emitting device according to claim 13 further comprising an electrode-insulating film that is arranged on or above the upper surface of said metal reflecting layer, which covers the side surfaces of said semiconductor structure, wherein said electrode-insulating film extends and covers a spaced part between said metal reflecting layer and the second metal reflecting layer, wherein n-side and p-side pad electrodes are arranged on or above the upper surface of said electrode-insulating film as pad electrode, and are spaced away from each other.

15. The semiconductor light emitting device according to claim 1, wherein a thickness of said barrier layer in a direction which is substantially perpendicular to a direction in which the semiconductor structure is deposited is smaller in an upper part of said opening than a lower part of said opening.

16. The semiconductor light emitting device according to claim 1, wherein a side surface of said opening is substantially vertical.

17. The semiconductor light emitting device according to claim 1, wherein the number of barrier layer is the same as the number of the openings.

18. The semiconductor light emitting device according to claim 1, wherein a side surface of said opening is inclined, and a side surface of said barrier layer is formed on the inclined side surface of said dielectric film.

19. The semiconductor light emitting device according to claim 18, wherein said dielectric film is constructed of multilayers.

20. The semiconductor light emitting device according to claim 18, wherein said metal reflecting layer is formed of aluminum or aluminum alloy.

21. The semiconductor light emitting device according to claim 18, wherein said barrier layer is formed of at least one element, or an alloy of at least one element selected from a group consisting of Au, Ag, Pt, Pd, Rh, Ir, Ru and Os.

22. The semiconductor light emitting device according to claim 18, further comprising a tight contact layer that is arranged between said barrier layer and said transparent electrically-conducting layer, and is formed of at least one metal or an alloy of at least one metal selected from a group consisting of Ti, Ni, Cr and Mo.

23. The semiconductor light emitting device according to claim 18, wherein said transparent electrically-conducting layer is formed of ITO.

24. The semiconductor light emitting device according to claim 18, wherein a film thickness of said barrier layer is thinner than said dielectric film.

25. The semiconductor light emitting device according to claim 18, wherein said barrier layer is formed only in said opening.

26. The semiconductor light emitting device according to claim 18, wherein said dielectric film covers side surfaces of said semiconductor structure.

27. The semiconductor light emitting device according to claim 18, wherein a thickness of said barrier layer in a direction which is substantially perpendicular to a direction in which the semiconductor structure is deposited is smaller in an upper part of said opening than a lower part of said opening.

28. A semiconductor light emitting device comprising:
a semiconductor structure that includes an active region;
a transparent electrically-conducting layer that is formed on or above an upper surface of said semiconductor structure;
a dielectric film that is formed on or above an upper surface of said transparent electrically-conducting layer; and
a metal reflecting layer that is formed on or above an upper surface of said dielectric film, wherein said dielectric film defines at least one opening to partially expose said transparent electrically-conducting layer therethrough, wherein said transparent electrically-conducting layer is electrically connected to said metal reflecting layer through said opening, wherein a barrier layer is partially formed covering said opening so that the barrier layer is interposed between said transparent electrically-conducting layer and the metal reflecting layer, wherein said metal reflecting layer covers side surfaces of said semiconductor structure, wherein said semiconductor structure includes n-type and p-type semiconductor layers, wherein said metal reflecting layer, which covers the side surfaces of said semiconductor structure, covers the n-type semiconductor layer, wherein said metal reflecting layer is spaced away from a second metal reflecting layer that covers the p-type semiconductor layer, wherein said semiconductor light emitting device further comprises an electrode-insulating film that is arranged on or above an upper surface of said metal reflecting layer, which covers the side surfaces of said semiconductor structure, wherein said electrode-insulating film extends and covers a spaced part between said metal reflecting layer and the second metal reflecting layer, and wherein n-side and p-side pad electrodes are arranged on or above an upper surface of said electrode-insulating film as pad electrode, and are spaced away from each other.

29. The semiconductor light emitting device according to claim 28, wherein said dielectric film is constructed of multilayers.

30. The semiconductor light emitting device according to claim 28, wherein said metal reflecting layer is formed of aluminum or aluminum alloy.

31. The semiconductor light emitting device according to claim 28, wherein said barrier layer is formed of at least one element, or an alloy of at least one element selected from a group consisting of Au, Ag, Pt, Pd, Rh, Ir, Ru and Os.

32. The semiconductor light emitting device according to claim 28, further comprising a tight contact layer that is arranged between said barrier layer and said transparent electrically-conducting layer, and is formed of at least one metal or an alloy of at least one metal selected from a group consisting of Ti, Ni, Cr and Mo.

33. The semiconductor light emitting device according to claim 28, wherein said transparent electrically-conducting layer is formed of ITO.

34. The semiconductor light emitting device according to claim 28, wherein a film thickness of said barrier layer is thinner than said dielectric film.

35. The semiconductor light emitting device according to claim 28, wherein said barrier layer is formed only in said opening.

36. The semiconductor light emitting device according to claim 28, wherein said dielectric film covers side surfaces of said semiconductor structure.

37. The semiconductor light emitting device according to claim 28, wherein a thickness of said barrier layer in a direction which is substantially perpendicular to a direction in which the semiconductor structure is deposited is smaller in an upper part of said opening than a lower part of said opening.

* * * * *